(12) United States Patent
Aoki et al.

(10) Patent No.: US 7,713,836 B2
(45) Date of Patent: May 11, 2010

(54) METHOD FOR FORMING CONDUCTIVE LAYER AND SUBSTRATE HAVING THE SAME, AND METHOD FOR MANUFACTURING SEMICONDUCTOR DEVICE

(75) Inventors: Tomoyuki Aoki, Tochigi (JP); Takuya Tsurume, Tochigi (JP); Daiki Yamada, Tochigi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 390 days.

(21) Appl. No.: 11/902,799

(22) Filed: Sep. 25, 2007

(65) Prior Publication Data
US 2008/0096366 A1 Apr. 24, 2008

(30) Foreign Application Priority Data
Sep. 29, 2006 (JP) .............................. 2006-266264

(51) Int. Cl.
*H01L 21/30* (2006.01)
(52) U.S. Cl. .................. 438/455; 438/458; 438/584; 438/589; 257/E21.567; 257/E21.568
(58) Field of Classification Search ................. 438/455, 438/458, 584, 589; 257/E21.567, E21.568
See application file for complete search history.

(56) References Cited

U.S. PATENT DOCUMENTS

| 5,821,138 | A | 10/1998 | Yamazaki et al. | |
|---|---|---|---|---|
| 5,834,327 | A | 11/1998 | Yamazaki et al. | |
| 6,372,608 | B1 * | 4/2002 | Shimoda et al. | 438/455 |
| 6,376,333 | B1 | 4/2002 | Yamazaki et al. | |
| 6,866,949 | B2 | 3/2005 | Ota et al. | |
| 6,946,361 | B2 * | 9/2005 | Takayama et al. | 438/455 |
| 6,998,282 | B1 | 2/2006 | Yamazaki et al. | |
| 7,282,380 | B2 * | 10/2007 | Maruyama et al. | 438/30 |
| 7,622,361 | B2 * | 11/2009 | Goto et al. | 438/455 |
| 2002/0020053 | A1 * | 2/2002 | Fonash et al. | 29/623.1 |
| 2007/0111391 | A1 | 5/2007 | Aoki et al. | |

FOREIGN PATENT DOCUMENTS

| JP | 07-157727 | 6/1995 |
|---|---|---|
| JP | 2003-136628 | 5/2003 |
| JP | 2004-310502 | 11/2004 |

\* cited by examiner

*Primary Examiner*—Michael Trinh
(74) *Attorney, Agent, or Firm*—Eric J. Robsinson; Robinson Intellectual Property Law Office, P.C.

(57) ABSTRACT

A separation layer is formed over a substrate having a depressed portion, using a silane coupling agent; a conductive layer and an insulating layer that covers the conductive layer are formed in the depressed portion over the separation layer; and a sticky member is attached to the insulating layer, then the conductive layer and the insulating layer are separated from the substrate. Alternatively, after these steps, a flexible substrate is attached to the conductive layer and the insulating layer.

25 Claims, 17 Drawing Sheets

METHOD FOR FORMING CONDUCTIVE LAYER AND SUBSTRATE HAVING THE SAME, AND METHOD FOR MANUFACTURING SEMICONDUCTOR DEVICE

BACKGROUND OF THE INVENTION

1. Field of the Invention

The present invention relates to a method for forming a conductive layer and a substrate having the conductive layer. Further, the present invention also relates to a method for manufacturing a semiconductor device having a conductive layer.

2. Description of the Related Art

Conventional methods for forming a conductive layer serving as an antenna, a pixel electrode, a wiring, or the like over a flexible substrate include the following: a method in which a composition that contains particles including a metal element is printed over a flexible substrate by a screen printing method and the composition is then heated and baked to form a conductive layer; and a method in which a conductive layer is formed over a flexible substrate by a plating method.

Patent Document 1: Japanese Published Patent Application No. 2004-310502

In order to form a low-resistance conductive layer by using a composition that contains particles including a metal element, the composition is preferably heated and baked at a high temperature, typically, 200° C. or higher. However, depending on a material, some flexible substrates have a low glass transition temperature, which can be lower than a baking temperature of a composition that contains particles including a metal element. Therefore, there is a problem in that a flexible substrate is deformed in a case of directly printing a composition that contains particles including a metal element over the flexible substrate and performing heating and baking to form a low-resistance conductive layer.

On the other hand, in a plating method, a baking step is not necessary, and a low-resistance conductive layer can be formed at a comparatively low temperature from approximately room temperature to 100° C. However, in a plating method, there are problems in that dangerous chemicals such as sulfuric acid, hydrochloric acid, and cyanogens compounds are used and waste fluids cause pollution.

In a case where a composition is printed over a substrate by a screen printing method, compositions which are applied by filling mesh openings of a screen with the compositions are connected with each other so that they become a linear compound. Therefore, a thickness of a region where compositions have been applied by filling mesh openings of a screen with the compositions is different from that of a region where compositions are connected, and further, a composition having a side surface with a curved (uneven) shape is formed.

Accordingly, in a case where a plurality of conductive layers is formed, there is variation in the thickness and shape of conductive layers, and as a result, there is a problem in that variation in resistance of the conductive layers occurs.

When an antenna, such as a wireless chip capable of transmitting and receiving data wirelessly (also referred to as an ID tag, an IC tag, an IC chip, an RF (radio frequency) tag, a wireless tag, an electronic tag, or an RFID (radio frequency identification device)), is formed using such a conductive layer, inductance varies in a plurality of antennas, and a problem occurs in that variation in resonance frequency and electromotive force accompanying it occurs from one wireless chip to another wireless chip.

SUMMARY OF THE INVENTION

Based on the above, it is an object of the present invention to provide a method for forming conductive layers with little variation in resistance and flexible substrates having the conductive layers with a high yield. Further, it is also an object of the present invention to provide a method for manufacturing a semiconductor device that is small-sized, thin, and light-weight. Furthermore, it is another object of the present invention to provide a method for manufacturing a semiconductor device through less and safe steps.

One feature of the present invention is to include the steps of forming a separation layer over a substrate having a depressed portion, using a silane coupling agent; forming a conductive layer in the depressed portion over the separation layer; forming an insulating layer that covers the conductive layer; and attaching a sticky member to the insulating layer, then separating the conductive layer from the substrate.

Another feature of the present invention is to include the steps of forming a layer in which oxygen and silicon are bonded and an inactive group is bonded to the silicon, over a substrate having a depressed portion; forming a conductive layer in the depressed portion over the layer in which oxygen and silicon are bonded and an inactive group is bonded to the silicon; forming an insulating layer that covers the conductive layer; and attaching a sticky member to the insulating layer, then separating the conductive layer and the insulating layer from the substrate at the layer in which oxygen and silicon are bonded and an inactive group is bonded to the silicon.

Another feature of the present invention is to include the steps of forming a separation layer over a substrate having a depressed portion, using a silane coupling agent; forming a conductive layer in the depressed portion over the separation layer; forming an insulating layer that covers the conductive layer; and attaching a sticky member to the insulating layer, then separating the conductive layer and the insulating layer that covers the conductive layer from the substrate and attaching a flexible substrate to the conductive layer and the insulating layer that covers the conductive layer.

Another feature of the present invention is to include the steps of forming a depressed portion in a substrate; forming a separation layer over the substrate having the depressed portion, using a silane coupling agent; forming a conductive layer in the depressed portion over the separation layer; forming an insulating layer that covers the conductive layer; and attaching a sticky member to the insulating layer, then separating the conductive layer from the substrate.

Another feature of the present invention is to include the steps of forming a depressed portion in a substrate; forming a layer in which oxygen and silicon are bonded and an inactive group is bonded to the silicon, over the substrate having the depressed portion; forming a conductive layer in the depressed portion over the layer in which oxygen and silicon are bonded and an inactive group is bonded to the silicon; forming an insulating layer that covers the conductive layer; and attaching a sticky member to the insulating layer, then separating the conductive layer from the substrate at the layer in which oxygen and silicon are bonded and an inactive group is bonded to the silicon.

Another feature of the present invention is to include the steps of forming a separation layer over a substrate having a depressed portion, using a silane coupling agent; forming a conductive layer in the depressed portion over the separation layer; forming an insulating layer that covers the conductive layer; attaching a sticky member to the insulating layer, then separating the conductive layer and the insulating layer that covers the conductive layer from the substrate; and attaching a flexible substrate to the conductive layer.

Another feature of the present invention is to include the steps of forming a layer in which oxygen and silicon are bonded and an inactive group is bonded to the silicon, over a substrate having a depressed portion; forming a conductive layer in the depressed portion over the layer in which oxygen and silicon are bonded and an inactive group is bonded to the silicon; forming an insulating layer that covers the conductive layer; attaching a sticky member to the insulating layer, then separating the conductive layer and the insulating layer that covers the conductive layer from the substrate at the layer in which oxygen and silicon are bonded and an inactive group is bonded to the silicon; and attaching a flexible substrate to the conductive layer.

Another feature of the present invention is a semiconductor device including the conductive layer or including a flexible substrate having the conductive layer.

After the conductive layer and the insulating layer that covers the conductive layer are separated, the layer in which oxygen and silicon are bonded and an inactive group is bonded to the silicon that remains over one surface of the conductive layer and the insulating layer that covers the conductive layer may be removed. Further, after the layer in which oxygen and silicon are bonded and an inactive group is bonded to the silicon is removed, a flexible substrate may be attached to the conductive layer and the insulating layer that covers the conductive layer.

As examples of the conductive layer, a wiring, an electrode, a pixel electrode, an antenna, and the like can be given.

The insulating layer that covers the conductive layer preferably serves as a protective film for preventing deterioration and oxidization of the conductive layer.

Methods for forming a conductive layer include a droplet discharging method, a printing method such as screen printing, off-set printing, relief printing, or gravure printing, and the like. In addition, there is an evaporation method using a metal mask, a CVD method, a sputtering method, and the like. Further, a plurality of the above methods can be used.

In a case where a conductive layer is formed by using a composition, a heating temperature is desirably greater than room temperature and less than 400° C., preferably greater than or equal to 200° C. and less than or equal to 350° C., more preferably greater than or equal to 200° C. and less than or equal to 300° C. When a heating temperature of the composition is lower than room temperature, the composition is not baked sufficiently. When the heating temperature of the composition is greater than or equal to 400° C., the layer in which oxygen and silicon are bonded and an inactive group is bonded to the silicon reacts, and that makes it difficult to easily separate the conductive layer and the insulating layer that covers the conductive layer from the substrate subsequently.

In a case where a conductive layer is a conductive layer serving as an antenna, a semiconductor device capable of transmitting and receiving data without contact is a typical example of a semiconductor device. Furthermore, in a case where the conductive layer is a pixel electrode, a display device is a typical example of the semiconductor device.

A layer in which oxygen and silicon are bonded and an inactive group is bonded to the silicon is easily divided by physical force; therefore, a conductive layer over the layer in which oxygen and silicon are bonded and an inactive group is bonded to the silicon can be separated from a substrate. Accordingly, the conductive layer that is formed over a substrate having heat resistance can be separated from the substrate, and the conductive layer can be easily formed.

Further, a flexible substrate having a conductive layer can be formed by attaching the conductive layer to a flexible substrate having low heat resistance. Therefore, conductive layers can be formed with a high yield, using a composition for which baking at a glass transition temperature of the flexible substrate or higher is necessary in a forming step. In a case where a composition that contains particles including a metal element is used, flexible substrates having conductive layers with little variation in resistance can be formed with a high yield.

By applying the composition to the depressed portion of the substrate, unevenness on a side surface of the printed composition can be reduced, and variation in shape and thickness can be reduced. Further, a width of the composition can be controlled, and thinning is possible. Furthermore, since the conductive layer can be formed without using a photolithography step, the number of processes and materials can be reduced, and therefore cost can be reduced.

By using such a conductive layer for an antenna, antennas with little variation in inductance can be formed. In addition, an antenna having high electromotive force can be formed. Further, by using such a layer for a wiring, a pixel electrode, or the like, semiconductor devices can be manufactured with a high yield. Furthermore, by using a flexible substrate having such a layer, formation of a semiconductor device that is small-sized, thin, and lightweight can be achieved. A semiconductor device can be manufactured through less and safe steps, and therefore cost of the semiconductor device can be reduced.

DETAILED DESCRIPTION OF THE INVENTION

Figure 1A:
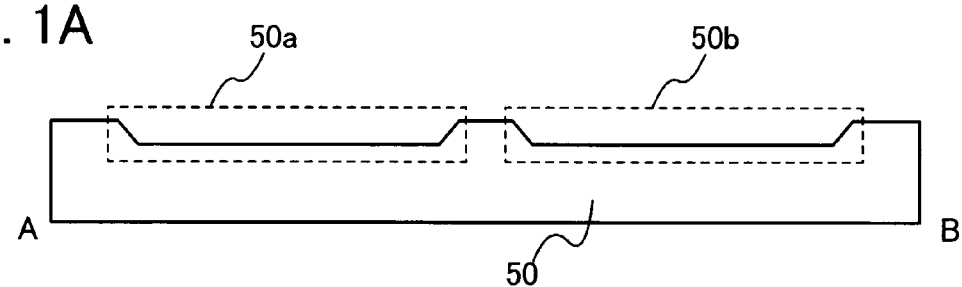
FIGS. 1A to 1E are cross-sectional views showing a step of forming a conductive layer of the present invention.

Hereinafter, embodiment modes of the present invention will be described with reference to drawings. However, the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of the embodiment modes given below. It is to be noted that the same portion or a portion having the same function is denoted by the same reference numeral in all drawings for explaining embodiment modes, and the repetitive explanation thereof is omitted.

Embodiment Mode 1

Figure 5:
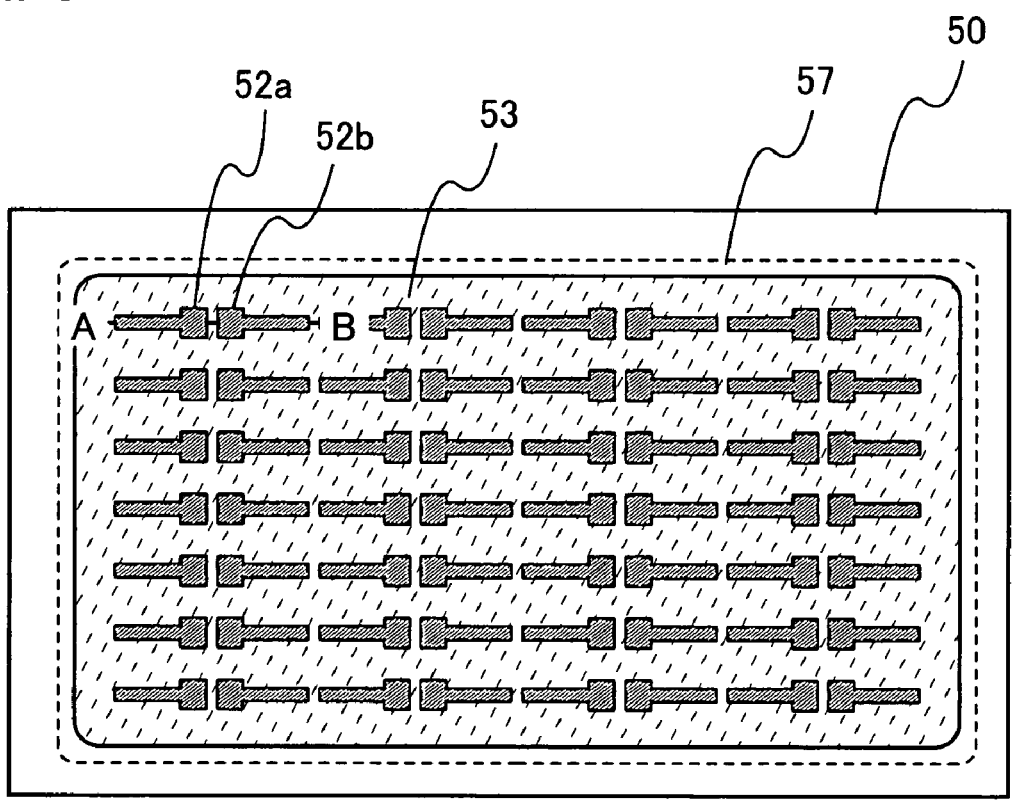
FIG. 5 is a top view showing a step of forming a conductive layer of the present invention.

In this embodiment mode, one mode of a method for easily forming a conductive layer is described with reference to FIGS. 1A to 1E, FIG. 5, and FIGS. 12A and 12B. FIGS. 1A to 1E show cross-sectional views of a step of forming a conductive layer. FIG. 5 shows a top view of FIG. 1A. A cross-sectional view taken along a line A-B of FIG. 1A corresponds to a region A-B of a top view of FIG. 5. The conductive layer here serves as an antenna. In addition, a pixel electrode, a wiring, an electrode, and the like can be used as an application of a conductive layer, instead of an antenna.

As shown in FIG. 1A, a substrate 50 having depressed portions 50a and 50b is prepared.

As the substrate 50, a substrate having heat resistance against a baking temperature of conductive layers 52a and 52b is preferably used. Typically, a glass substrate, a quartz substrate, a ceramic substrate, a metal substrate, a silicon wafer, an organic resin layer, or the like can be used.

As the cross-sectional shapes of the depressed portions 50a and 50b, a triangle, a quadrilateral, a trapezoid, a polygon, a semicircle, or the like can be appropriately used. In order to uniformly divide a layer in which oxygen and silicon are bonded and an inactive group is bonded to the silicon in the depressed portions 50a and 50b, a semicircle, a trapezoid, or a polygon is preferable as the shapes thereof. In a case where the conductive layers 52a and 52b are connected to other conductive materials later through openings in a flexible substrate, the cross-sectional shapes of the depressed portions 50a and 50b are preferably a quadrilateral, a trapezoid, a polygon, a semicircle, or the like in order to increase a contact area. Here, a glass substrate is used as the substrate 50, and a trapezoid is used as the cross-sectional shapes of the depressed portions 50a and 50b.

Figure 1B:
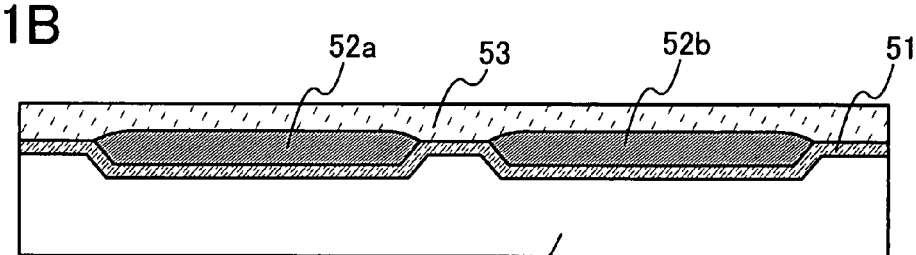

Next, as shown in FIG. 1B, over the substrate 50 having the depressed portions 50a and 50b, a layer 51 in which oxygen and silicon are bonded and an inactive group is bonded to the silicon is formed as a separation layer using a silane coupling agent. The conductive layers 52a and 52b are formed in the depressed portions 50a and 50b over the layer 51 in which oxygen and silicon are bonded and an inactive group is bonded to the silicon. An insulating layer 53 that covers the conductive layers 52a and 52b is formed.

As the layer 51 in which oxygen and silicon are bonded and an inactive group is bonded to the silicon, a layer having high adhesion to the substrate 50 and low surface energy compared to a composition that is applied afterwards is preferably formed. The layer 51 in which oxygen and silicon are bonded and an inactive group is bonded to the silicon is formed using a silane coupling agent. The silane coupling agent is a silicon compound represented by $R_n$—Si—$X_{(4-n)}$ (n=1, 2, 3) (R represents a functional group that is at least one kind selected from an alkyl group, an aryl group, a fluoroalkyl group, and a fluoroaryl group, and X represents an alkoxyl group). A layer formed using the silane coupling agent becomes a layer in which oxygen and silicon are bonded and an inactive group is bonded to the silicon. The inactive group corresponds to R in the structural formula of the silane coupling agent.

As a typical alkoxyl group, an alkoxyl group having 1 to 4 carbon atoms, typically, a methoxy group, an ethoxy group, a propyloxy group, an isopropyloxy group, a butoxy group, an isobutoxy group, an s-butoxy group, a t-butoxy group or the like is given.

The number of the alkoxyl group is 1 to 3 of monoalkoxysilane, dialkoxysilane, trialkoxysilane, and the like.

As a typical example of a silicon compound containing an alkyl group as R, alkoxysilane containing an alkyl group having 2 to 30 carbon atoms is preferably used. Typically, ethyltriethoxysilane, propylethoxysilane, octyltriethoxysilane, decyltriethoxysilane, octadecyltriethoxysilane (ODS), eicosyltriethoxysilane, triacontyltriethoxysilane, and the like are given.

As alkoxylsilane containing an aryl group as R, alkoxysilane containing an aryl group having 6 to 8 carbon atoms is preferably used. Typically, phenyltriethoxysilane, benzyltriethoxysilane, phenethyltriethoxysilane, toluiltriethoxysilane, and the like are given.

As alkoxylsilane containing a fluoroalkyl group as R, a fluoroalkyl group having 3 to 12 carbon atoms is preferably used. Typically, (3,3,3-trifluoropropyl)trietoxysilane, (tridecafluoro-1,1,2,2-tetrahydrooctyl)trietoxysilane, (heptadecafluoro-1,1,2,2-tetrahydrodecyl)triethoxysilane, (henicosafluoro-1,1,2,2-tetrahydrodecyl)triethoxysilane, and the like are given.

As alkoxylsilane containing a fluoroaryl group as R, alkoxysilane containing a fluoroaryl group having 6 to 9 carbon atoms is preferably used. Typically, pentafluorophenyltriethoxysilane, (pentafluorophenyl)propyltriethoxysilane, and the like are given.

It is to be noted that the layer in which oxygen and silicon are bonded and an inactive group is bonded to the silicon may be formed using a solution in which a silane coupling agent is dissolved in a solvent. As the solvent in this case, hydrocarbon such as toluene, xylene, or hexadecane, a halogen solvent such as chloroform, tetrachloride, trichloroethylene, or tetrachloroethylene, alcohol such as methanol, ethanol, n-propanol, or isopropanol, and the like are given.

As a method for forming the layer 51 that is a separation layer in which oxygen and silicon are bonded and an inactive group is bonded to the silicon, a droplet discharging method, a printing method such as screen printing, off-set printing, relief printing, or gravure printing, or the like can be used. Alternatively, a vacuum evaporation method, an evaporation method, a CVD method, a sputtering method, or the like can be used. Here, a droplet discharging method indicates a method for forming a pattern with a predetermined shape by discharging a droplet of a composition from a minute hole.

Here, the layer 51 in which oxygen and silicon are bonded and an inactive group is bonded to the silicon is formed by evaporating fluoroalkylsilane by an evaporation method.

A composition that contains particles including a metal element is applied by a coating method in the depressed portions 50a and 50b over the layer 51 in which oxygen and silicon are bonded and an inactive group is bonded to the silicon, and the composition is heated and particles including a metal element are baked, so that the conductive layers 52a and 52b are formed. As a coating method, a droplet discharging method, a printing method such as screen printing, off-set printing, relief printing, or gravure printing, or the like can be used. In addition, an evaporation method using a metal mask, a CVD method, a sputtering method, or the like can be used. Moreover, a plurality of the above methods can be used. Further, the composition is formed from particles including a metal element and a solvent that disperses the particles including a metal element.

A heating temperature of the composition is desirably greater than or equal to 200° C. and less than or equal to 350° C., preferably, greater than or equal to 200° C. and less than or equal to 300° C. When a heating temperature of the composition is lower than 200° C., the particles including a metal element is insufficiently baked and a conductive layer having high resistance is formed. Alternatively, when the composition is heated at a higher temperature than 350° C., the layer in which oxygen and silicon are bonded and an inactive group is bonded to the silicon reacts and it becomes difficult to easily separate the conductive layer from the substrate afterwards.

As the particles including a metal element, one or more of conductive particles of Ag, Au, Cu, Ni, Pt, Pd, Ir, Rh, W, Al, Ta, Mo, Cd, Zn, Fe, Ti, Zr, and Ba, or a compound particle having the element can be appropriately used.

Further, as particles including a metal element, a composition that contains one or more of elements of In, Ga, Al, Sn, Ge, Sb, Bi, and Zn, or two or more of compound particles is heated and baked, so that a conductive layer having a light-transmitting property can be formed.

As the compound particle including a metal element, an inorganic salt particle such as a metal halide, a metal sulfate, a metal nitrate, metal oxide, metal hydroxide, or a metal carbonate, or an organic salt particle such as a metal acetate, a metal oxalate, or a metal tartrate can be appropriately used.

A diameter of the particles including a metal element is preferably several nm to several tens of μm, preferably 1 nm to 100 nm, 2 nm to 50 nm, further preferably 3 nm to 20 nm. By using such particles with a small grain size, the resistance of a conductive layer formed afterwards can be reduced.

In addition to the particles including a metal element, particles such as carbon, silicon, or germanium may be appropriately used.

As the solvent that disperses the particles including a metal element, ester such as butyl acetate or ethyl acetate, alcohol such as isopropyl alcohol or ethyl alcohol, methyl ethyl ketone, acetone, an organic resin such as an epoxy resin or a silicon resin (silicone), or the like is appropriately used.

As the conductive layers 52a and 52b, a conductive layer serving as an antenna, a wiring, a pixel electrode, an electrode, or the like can be appropriately formed.

Here, a composition that has silver particles is printed by a printing method, and baking is performed, so that the conductive layers 52a and 52b are formed.

Figure 12A:
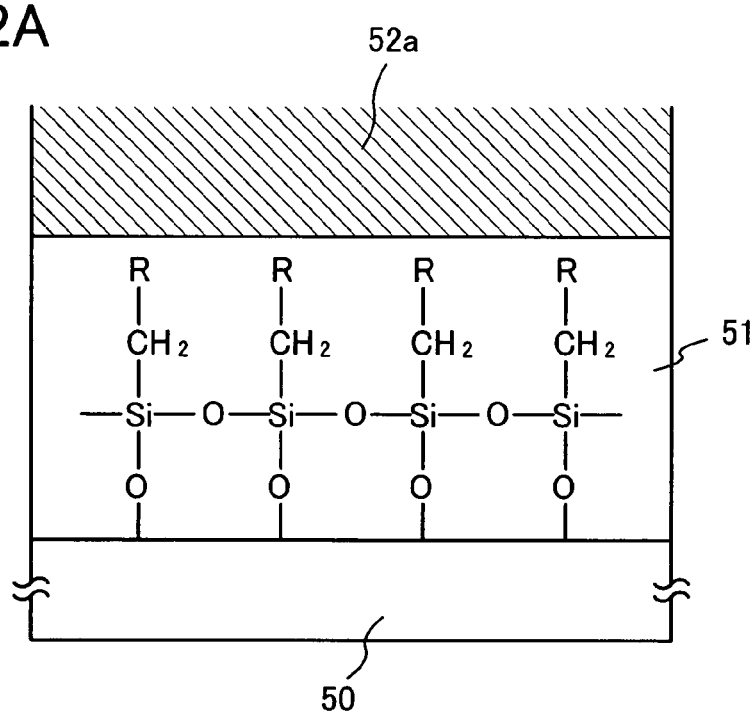
FIGS. 12A and 12B are model views showing a step of forming a conductive layer of the present invention.

Here, a shape of the composition that is applied over the layer 51 in which oxygen and silicon are bonded and an inactive group is bonded to the silicon is described with reference to FIG. 12A. FIG. 12A is an enlarged model view for showing a region where the substrate 50 and the conductive layer 52a of FIG. 1A are in contact with the layer 51 in which oxygen and silicon are bonded and an inactive group is bonded to the silicon of FIG. 1A.

In FIG. 12A, over the substrate 50, here, over a surface of a glass substrate, oxygen over the surface of the glass substrate and silicon in the layer 51 in which oxygen and silicon are bonded and an inactive group is bonded to the silicon are bonded, and the silicon and a functional group that is at least one kind selected from an alkyl group, an aryl group, a fluoroalkyl group, and a fluoroaryl group are bonded. Further, the adjacent silicon is combined to each other through oxygen. Here, a substituent that is part of the functional group R is referred to as a $CH_2$ group and illustrated between the functional group R and silicon. It is to be noted that various substituents are shown without limitation to the $CH_2$ group as long as they are part of the functional group R.

In addition, a functional group R that is at least one kind selected from an alkyl group, an aryl group, a fluoroalkyl group, and a fluoroaryl group is exposed on the surface of the layer 51 in which oxygen and silicon are bonded and an inactive group is bonded to the silicon. Further, the conductive layer 52a is formed in contact with the functional group R.

An inactive functional group R typified by at least one kind selected from an alkyl group, an aryl group, a fluoroalkyl group, and a fluoroaryl group is exposed on the surface of the layer 51 in which oxygen and silicon are bonded and an inactive group is bonded to the silicon; therefore, surface energy in the surface of the layer 51 in which oxygen and silicon are bonded and an inactive group is bonded to the silicon is relatively lowered.

Further, as a carbon chain length of a functional group becomes longer, a contact angle becomes larger, and the surface energy is relatively lowered. Accordingly, a composition having different surface energy from the surface energy of the layer 51 is easily repelled over the layer, and in a depressed portion, the composition flows over a surface of the layer having small surface energy and stays in a stabilized shape.

In other words, the composition that is applied over the layer in which oxygen and silicon are bonded and an inactive group is bonded to the silicon comes to have a shape such that the surface energy of the composition is stabilized. Therefore, unevenness on a side face of the applied composition is reduced. By drying and baking such a paste, a conductive layer of which unevenness on a side face is moderated can be formed. Further, variation in shape and thickness can be reduced, and accordingly, variation in resistance of the conductive layer can be reduced. Furthermore, a width of the composition can be controlled, and thinning of the conductive layer is possible.

An insulating composition is applied over an exposed portion of the layer 51 in which oxygen and silicon are bonded and an inactive group is bonded to the silicon and the conductive layers 52a and 52b, and heating and baking are performed, so that the insulating layer 53 that covers the conductive layers 52a and 52b is formed. As a coating method of the insulating composition, a coating method for the conductive layers 52a and 52b can be appropriately used. Further, as the insulating composition, an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; a siloxane polymer typified by silica glass; an alkylsiloxane polymer; an alkylsilsesquioxane polymer; a silsesquioxane hydride polymer; an alkylsilsesquioxane hydride polymer; or the like can be appropriately used.

The insulating layer 53 can be formed by a gas phase method such as a vacuum evaporation method, an evaporation method, a CVD method, or a sputtering method. As the insulating layer formed using a gas phase method, a silicon oxide layer, a silicon nitride layer, a silicon oxynitride layer, an aluminum nitride layer, or the like can be appropriately used.

In the present invention, the insulating layer 53 is preferably formed extending to an outer side of a region where the conductive layers 52a and 52b are formed (an inside of a dot line 57 of FIG. 5) as shown in FIG. 5. That is, the insulating layer 53 is preferably formed to cover the whole conductive layer so as not to expose part of the side face of the conductive layer from the insulating layer. As a result, the conductive layers 52a and 52b are sealed by the insulating layer 53; therefore, oxidization of the conductive layer and mixture of an impurity can be prevented, and deterioration of the conductive layer can be suppressed. Further, since the insulating layer is formed so as to entirely cover the conductive layer, the conductive layer can be separated as one layer without being divided in a subsequent separating step.

Here, an epoxy resin is printed by a printing method, so that the insulating layer 53 is formed.

Figure 1C:
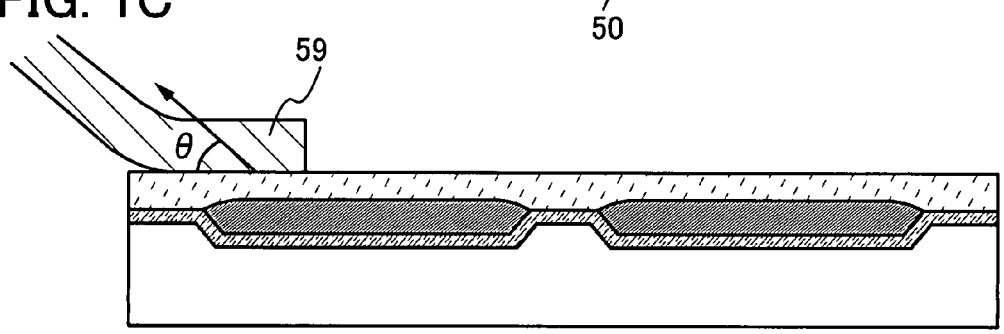

Next, as shown in FIG. 1C, a sticky member 59 is attached to a surface of the insulating layer 53, typically, to part of or to an entire surface of the insulating layer 53, and then the layer 51 in which oxygen and silicon are bonded and an inactive group is bonded to the silicon is physically divided with the use of the sticky member 59. Typically, the sticky member 59 is pulled in a direction of an angle of θ degree with respect to a surface of the layer 51 in which oxygen and silicon are bonded and an inactive group is bonded to the silicon or the insulating layer 53. The angle of θ degree is other directions than a horizontal direction, specifically, $0°<\theta<180°$, preferably $0°<\theta\leq60°$, more preferably $0°\leq\theta\leq45°$. As a result, the conductive layers 52a and 52b and the insulating layer 53 can be separated from the substrate 50 while a crack is prevented from occurring in the conductive layers 52a and 52b and the insulating layer 53. That is, the layer 51 in which oxygen and silicon are bonded and an inactive group is bonded to the silicon is divided, and the conductive layers 52a and 52b and the insulating layer 53 are separated from the substrate 50 at the layer 51 in which oxygen and silicon are bonded and an inactive group is bonded to the silicon. At this time, a part 51a of the layer in which oxygen and silicon are bonded and an inactive group is bonded to the silicon remains over the substrate 50, and a part 51b of the layer in which oxygen and silicon are bonded and an inactive group is bonded to the silicon remains over the conductive layers 52a and 52b and the insulating layer 53. At this time, a roller is used as the sticky member 59 and a transferring means is provided below the substrate, and rotation speed of the roller, a radius of rotation, pressure from the roller, a distance between the roller and the substrate, traveling speed of the transferring means, and the like are appropriately adjusted. Thus, the conductive layers 52a and 52b and the insulating layer 53 can be easily separated from the substrate 50.

Figure 1D:
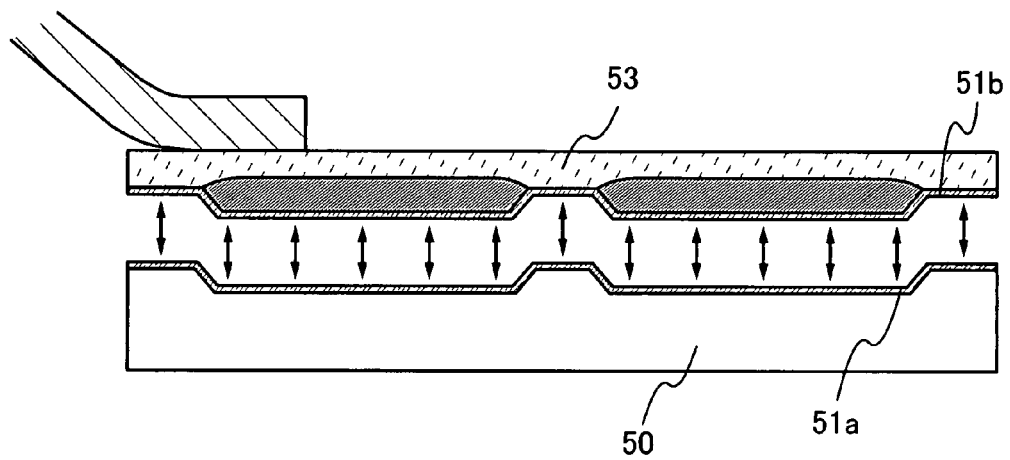
Figure 12B:
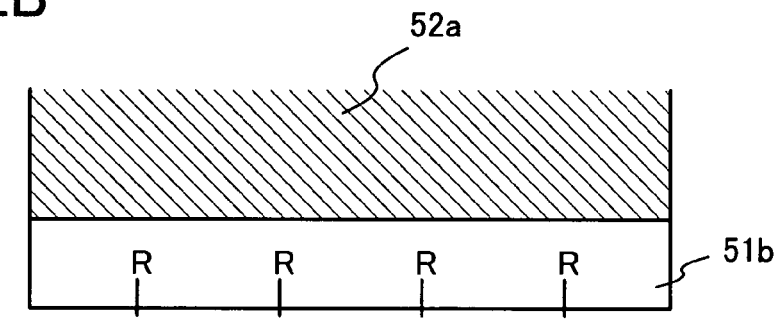
Figure 12B:
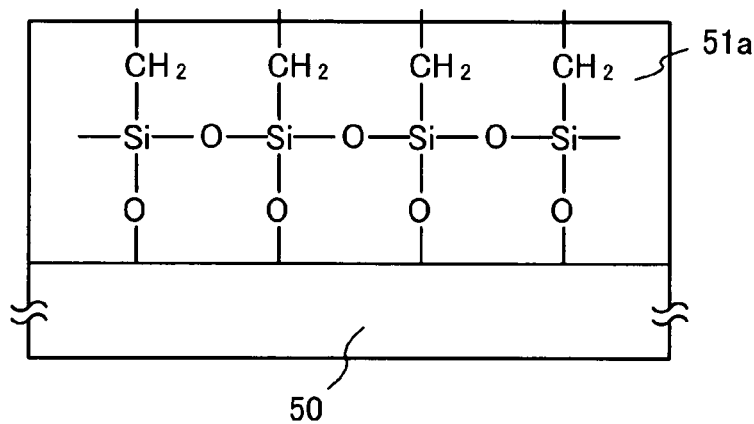

Here, a principle that the layer 51 in which oxygen and silicon are bonded together and an inactive group is bonded to the silicon is divided and the conductive layers 52a and 52b and the insulating layer 53 are separated from the substrate 50 is described with reference to a model view of FIG. 12B. When the sticky member 59 is pulled up as shown in FIG. 12B, the bonding power inside the inactive group is low as compared to adhesion between a surface of the substrate 50 and the layer 51 in which oxygen and silicon are bonded and an inactive group is bonded to the silicon and adhesion between the layer 51 in which oxygen and silicon are bonded and an inactive group is bonded to the silicon and the conductive layer 52a. In other words, the bonding power inside the inactive group is weak as compared to bonding power of oxygen and silicon over the substrate 50 and adhesion between the conductive layers 52a and 52b and the layer 51 in which oxygen and silicon are bonded and an inactive group is bonded to the silicon. Therefore, as shown in FIG. 12B, the bond of the functional group R that is at least one kind selected from an alkyl group, an aryl group, a fluoroalkyl group, and a fluoroaryl group is partially cut off, and the layer in which oxygen and silicon are bonded and an inactive group is bonded to the silicon is divided. As a result, as shown in FIG. 1D, the conductive layers 52a and 52b and the insulating layer 53 can be separated from the substrate 50.

Since the bond of the functional group R that is at least one kind selected from an alkyl group, an aryl group, a fluoroalkyl group, and a fluoroaryl group is partially cut off, a remaining part of the alkyl group, the aryl group, the fluoroalkyl group, and the fluoroaryl group is left over the surface of the substrate. Accordingly, a contact angle is large and the surface energy is relatively small over a surface of the part 51b of the layer in which oxygen and silicon are bonded and an inactive group is bonded to the silicon that is divided. Therefore, a composition having different surface energy from the surface energy of the part 51a of the layer is easily repelled over the layer, and the composition flows over a surface of a film having small surface energy and stays in a stabilized shape. As a result, the substrate 50 having the part 51a of the layer in which oxygen and silicon are bonded and an inactive group is bonded to the silicon that is divided can be used to form a conductive layer again.

Here, as the sticky member 59, an optical plastic sticky film, a thermoplastic sticky film, or the like can be used. Further, as the sticky member 59, a sticky tape, sheet, substrate, roller, or the like can be appropriately used. Moreover, instead of the sticky member, a member attached to the surface of the insulating layer 53 by electrostatic force or adsorption power may be attached. Here, as the sticky member 59, a sticky roller is used.

Figure 1E:
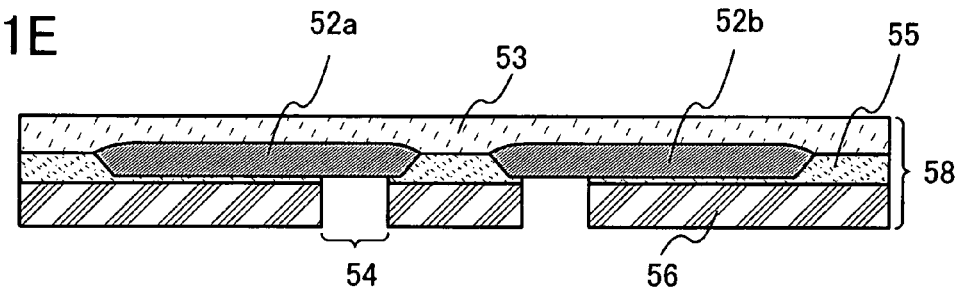

Next, as shown in FIG. 1E, the part 51b of the layer in which oxygen and silicon are bonded and an inactive group is bonded to the silicon that remains over a surface of the conductive layers 52a and 52b and the insulating layer 53 is removed. The part of the layer in which oxygen and silicon are bonded and an inactive group is bonded to the silicon can be removed by plasma irradiation of hydrogen, a rare gas, nitrogen, or the like, or heating treatment at 400° C. or higher. Through the above steps, the conductive layers and the insulating layer that covers the conductive layers can be easily formed. In addition, by applying the composition to the depressed portion of the substrate, unevenness on a side face of the printed composition can be reduced, and thus variation in shape and thickness of the conductive layer can be reduced. Accordingly, variation in resistance of the conductive layer can be reduced.

Next, a flexible substrate 56 having an opening 54 is attached to the conductive layers 52a and 52b and the insulating layer 53. As the flexible substrate 56, a substrate made from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like, or a substrate having a stacked layer of paper made of a fibrous material, and an adhesive organic resin 55 (an acrylic-based organic resin, an epoxy-based organic resin, or the like) can be typically used.

Alternatively, as the flexible substrate 56, a film having an adhesive layer that is subjected to adhesion treatment with an object to be processed by thermocompression (such as a laminating film (including polypropylene, polyester, vinyl, polyvinyl fluoride, vinyl chloride, or the like)) may be used. The laminating film can be bonded to an object to be processed in such a way that an adhesive layer provided on an uppermost layer or a layer provided on an outermost layer (not the adhesive layer) is melted by heat treatment and then, by applying pressure thereto, the film is bonded to the object to be processed.

The flexible substrate 56 is formed to have a thickness of 1 μm to 500 μm, preferably 1 μm to 100 μm, more preferably 1 μm to 50 μm. By using the flexible substrate 56 which is thin, a thin semiconductor device can be manufactured.

Here, as the flexible substrate 56, a PEN (polyethylene naphthalate) film is used.

The opening 54 formed in the flexible substrate 56 can be formed by irradiating the flexible substrate with laser light and melting part of the flexible substrate. Alternatively, the flexible substrate is subjected to mechanical punching to form the opening.

Through the above steps, the flexible substrates 58 having the conductive layers can be formed with a high yield. Since the composition forming the conductive layer can be heated at a sufficient temperature, flexible substrates having conductive layers with low resistance can be formed with a high yield. A flexible substrate having a conductive layer can be formed through less and safe steps. By applying a composition to the depressed portion of the substrate, a conductive layer of which unevenness on a side surface is reduced can be formed, and variation in shape and thickness of the conductive layer can be reduced. Flexible substrates having conductive layers, which are thinned, can be formed with a high yield. In a case where an antenna is formed using these conductive layers, substrates having antennas with little variation in inductance in a plurality of antennas which is concurrently formed can be formed. Further, a substrate having an antenna with high electromotive force can be formed.

Embodiment Mode 2

In this embodiment mode, one mode of a method for easily forming a conductive layer is described with reference to FIGS. 2A to 2E. FIGS. 2A to 2E show cross-sectional views of a step of forming a conductive layer.

Figure 2A:
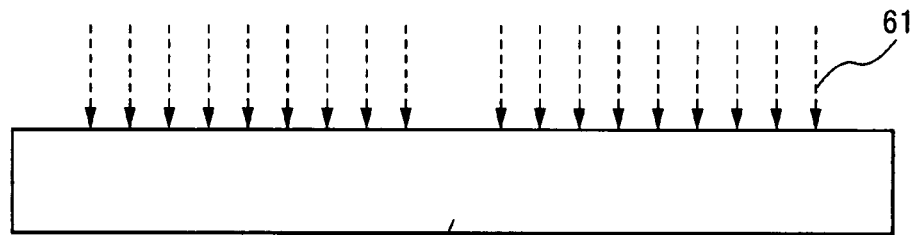
FIGS. 2A to 2E are cross-sectional views showing a step of forming a conductive layer of the present invention.
Figure 2B:
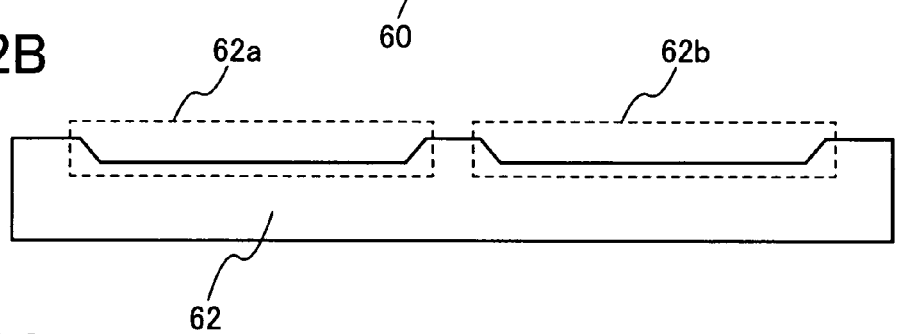

As shown in FIG. 2A, a substrate 60 having a flat surface is prepared, and a surface of the substrate 60 is selectively treated, so that depressed portions 62a and 62b as shown in FIG. 2B are formed.

As the substrate 60, a substrate having heat resistance against a baking temperature of conductive layers 52a and 52b is preferably used. Typically, a glass substrate, a quartz substrate, a ceramic substrate, a metal substrate, a silicon wafer, an organic resin substrate, or the like can be used.

As treatment by which the depressed portions 62a and 62b are formed in the substrate, laser light irradiation, cutting, etching of a substrate using a resist mask formed in a photolithography step, or the like can be given. In a case where the substrate is an organic resin substrate, the depressed portion can be formed in such a manner that after the organic resin substrate is heated and softened, a stamper is pressed against and detached from the organic resin substrate. The stamper is an object with a projection corresponding to the depressed portion. After the stamper is pressed against the organic resin substrate, the stamper is detached therefrom. Thus, the depressed portion can be formed.

Here, the substrate 60 is irradiated with a laser light 61, so that the depressed portions 62a and 62b are selectively formed as shown in FIG. 2B.

Figure 2C:
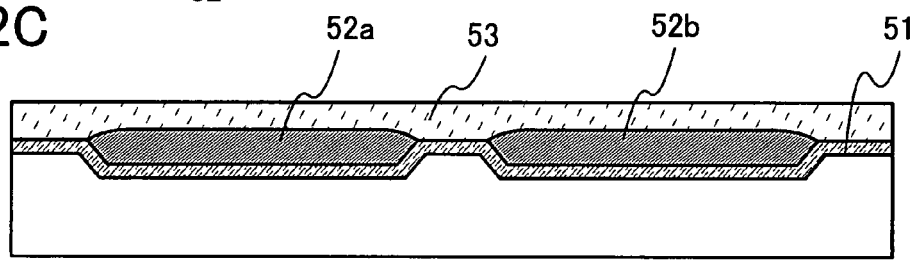

Next, as shown in FIG. 2C, in the same manner as in Embodiment Mode 1, over a substrate 62 having the depressed portions 62s and 62b, a layer 51 in which oxygen and silicon are bonded and an inactive group is bonded to the silicon is formed using a silane coupling agent. The conductive layers 52a and 52b are formed in the depressed portions 62a and 62b over the layer 51 in which oxygen and silicon are bonded and an inactive group is bonded to the silicon. An insulating layer 53 is formed to cover the conductive layers 52a and 52b.

Figure 2D:
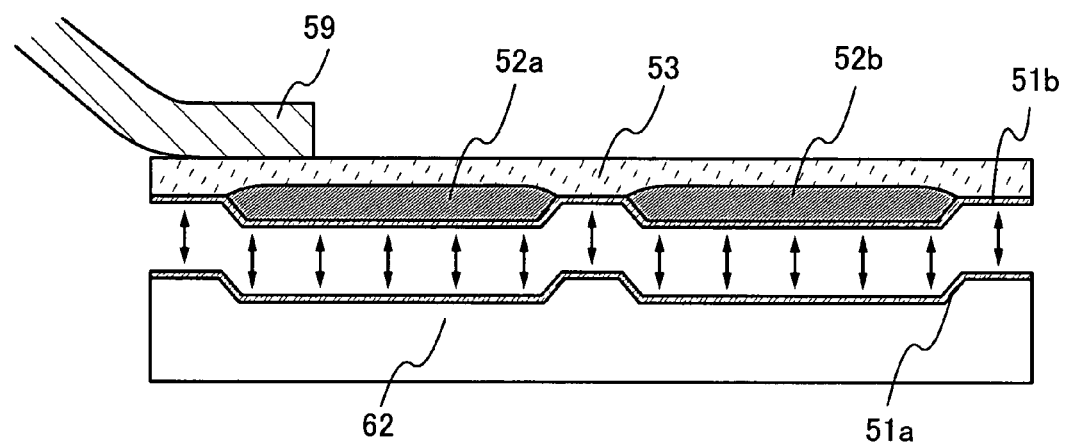

Next, as shown in FIG. 2D, in the same manner as in Embodiment Mode 1, a sticky member 59 is attached to a surface of the insulating layer 53, typically, to part of or to an entire surface of the insulating layer 53, and then the layer 51 in which oxygen and silicon are bonded and an inactive group is bonded to the silicon is physically divided with the use of the sticky member 59.

Figure 2E:
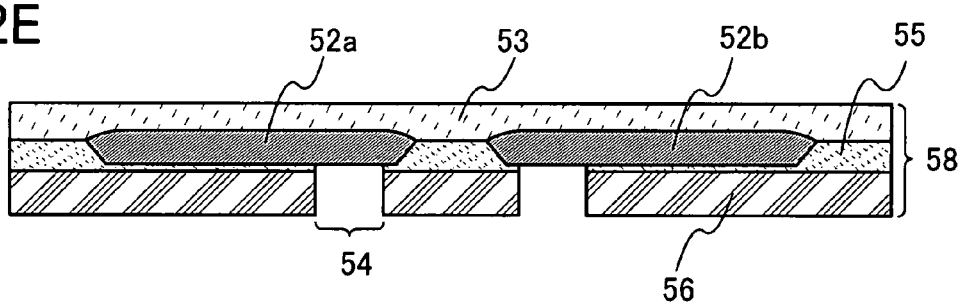

Then, as shown in FIG. 2E, in the same manner as in Embodiment Mode 1, a part 51b of the layer in which oxygen and silicon are bonded and an inactive group is bonded to the silicon that remains over a surface of the conductive layers 52a and 52b and the insulating layer 53 is removed. Then, a flexible substrate 56 having openings 54 is attached to the conductive layers 52a and 52b and the insulating layer 53.

Through the above steps, flexible substrates 58 having conductive layers can be formed with a high yield. The flexible substrate having a conductive layer can be formed through less and safe steps. By applying a composition to the depressed portion of the substrate, unevenness on a side surface of the printed composition can be reduced, and variation in shape and thickness of the conductive layer can be reduced. Therefore, variation in resistance of the conductive layers can be reduced. The depressed portion may be formed in accordance with design of the conductive layer, and therefore the number of choices in design can be increased.

Embodiment Mode 3

In this embodiment mode, a method for forming a conductive layer that can reduce variation in resistance in different conductive layers is described with reference to FIGS. 3A to 3D. Here, Embodiment Mode 1 is used for the description; however, Embodiment Mode 2 can also be applied.

Figure 3A:
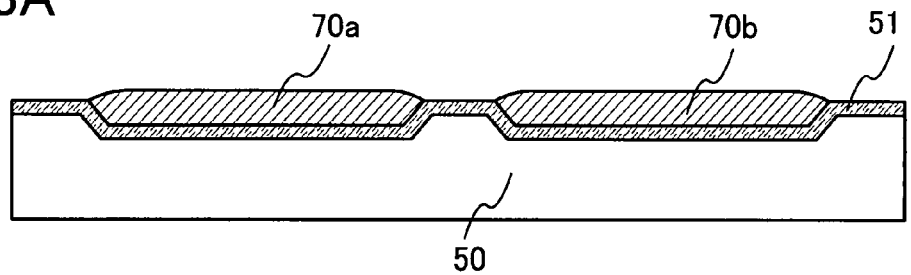
FIGS. 3A to 3D are cross-sectional views showing a step of forming a conductive layer of the present invention.

As shown in FIG. 3A, in the same manner as in Embodiment Mode 1, over a substrate 50 having depressed portions, a layer 51 in which oxygen and silicon are bonded and an inactive group is bonded to the silicon is formed using a silane coupling agent. Compositions 70a and 70b are applied in depressed portions 50a and 50b over the layer 51 in which oxygen and silicon are bonded and an inactive group is bonded to the silicon.

Next, portions of the compositions that are higher than a surface of the layer 51 in which oxygen and silicon are bonded and an inactive group is bonded to the silicon are removed to flatten a surface. Alternatively, a region in the compositions 70a and 70b where a surface of the compositions is at a position lower than a surface of the layer 51 in which oxygen and silicon are bonded and an inactive group is bonded to the silicon that is formed in a flat portion of the substrate, is newly filled with a composition.

Figure 3B:
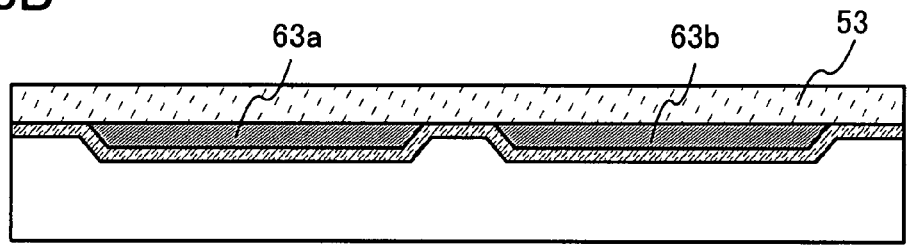

Typically, a composition that contains particles including a metal element is formed in the depressed portion, and a surface of the composition and the layer in which oxygen and silicon are bonded and an inactive group is bonded to the silicon is flattened by moving a squeegee or a spatula over the surface of the composition and the layer in which oxygen and silicon are bonded and an inactive group is bonded to the silicon. Subsequently, the composition is heated and the particles including a metal element are baked, so that conductive layers 63a and 63b with a flat surface are formed as shown in FIG. 3B. Next, an insulating layer 53 that covers the conductive layers 63a and 63b is formed.

Figure 3C:
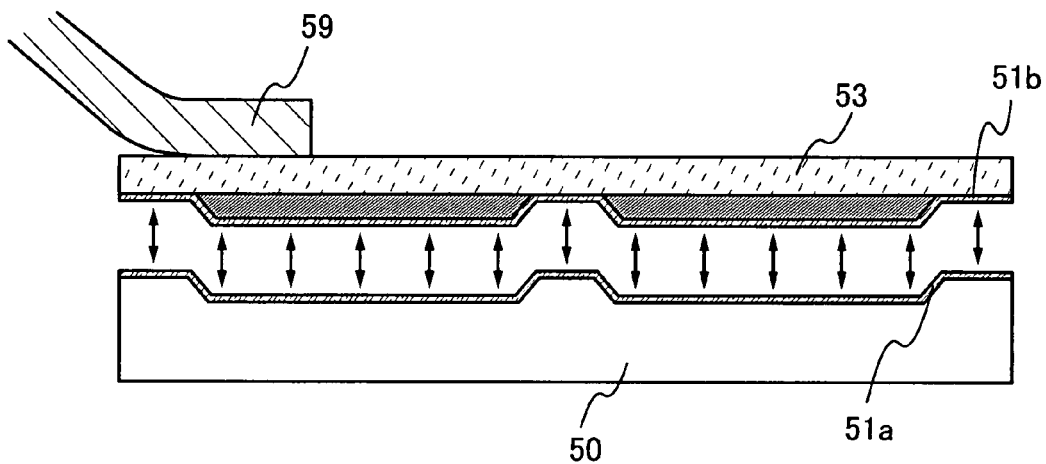

Next, as shown in FIG. 3C, in the same manner as in Embodiment Mode 1, a sticky member 59 is attached to a surface of the insulating layer 53, typically, to part of or to an entire surface of the insulating layer 53, and then the layer 51 in which oxygen and silicon are bonded and an inactive group is bonded to the silicon is physically divided with the use of the sticky member 59.

Figure 3D:
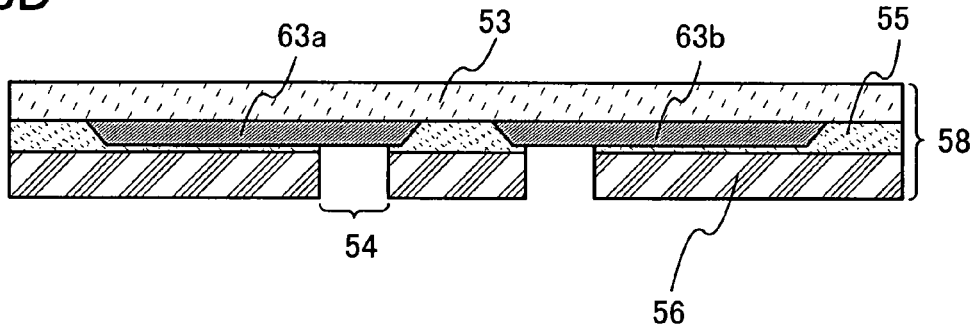

Then, as shown in FIG. 3D, in the same manner as in Embodiment Mode 1, a part 51b of the layer in which oxygen and silicon are bonded and an inactive group is bonded to the silicon that remains over a surface of the conductive layers 63a and 63b and the insulating layer 53 is removed. Then, a flexible substrate 56 having openings 54 is attached to the conductive layers 63a and 63b and the insulating layer 53, using an adhesive organic resin 55.

Through the above steps, flexible substrates 58 having conductive layers can be formed with a high yield. The flexible substrate having a conductive layer can be formed through less and safe steps. Further, variation in shape, thickness, resistance, and the like of a plurality of conductive layers can be reduced.

Embodiment Mode 4

In this embodiment mode, a semiconductor device manufactured using the flexible substrate having a conductive layer manufactured in the above-described embodiment mode is described with reference to FIG. 4. In this embodiment mode, description is made using a semiconductor device which is capable of transmitting and receiving data without contact (also referred to as an RFID (radio frequency identification device) tag, an IC chip, an IC tag, an ID chip, an ID tag, an RF chip, an RF tag, a wireless chip, or a wireless tag) as a semiconductor device. However, a display device can be used as a semiconductor device, and a pixel electrode can be manufactured as a conductive layer. Further, a flexible substrate having the pixel electrode can be used for a display device.

Figure 4:
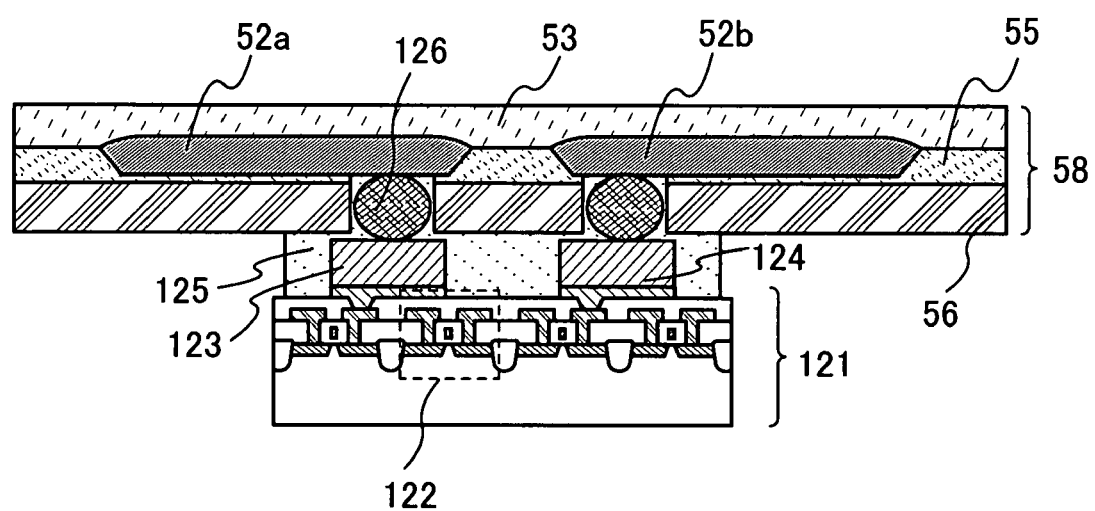
FIG. 4 is a cross-sectional view showing a semiconductor device having a conductive layer of the present invention.

As shown in FIG. 4, by attaching a flexible substrate 58 having a conductive layer to an integrated circuit, a semiconductor device can be manufactured. Here, a silicon chip 121 is used and shown as the integrated circuit. Instead of the silicon chip 121, an integrated circuit that includes a thin film transistor can be used as the integrated circuit.

Typically, connection terminals 123 and 124 of the silicon chip 121 where a plurality of elements are formed and conductive layers 52a and 52b are respectively connected with a conductive particle 126 contained in an anisotropic conductive adhesive material 125, whereby a MOS transistor 122 and the conductive layers 52a and 52b are electrically connected. As the plurality of elements, a MOS transistor, a capacitor element, a resistor, and the like are given. Here, the MOS transistors 122 are shown as the plurality of elements. A thickness of the silicon chip is preferably 0.1 µm to 700 µm, more preferably 0.1 µm to 20 µm, further preferably 1 µm to 5 µm.

The connection terminals 123 and 124 can be formed using titanium, nickel, gold, copper, or the like appropriately, by a printing method, an electrolytic plating method, an electroless plating method, a sputtering method, a droplet discharging method, or the like.

As a typical example of the anisotropic conductive adhesive material 125, an adhesive resin containing conductive particles 126 (each grain size is several nm to several tens µm), which are dispersed, such as an epoxy resin or a phenol resin can be given. The conductive particle 126 is formed from an element selected from gold, silver, copper, palladium, nickel, and platinum; or a plurality of elements. Further, a particle having a multi-layer structure of these elements may be used. Furthermore, a conductive particle in which a thin film that is formed from an element selected from gold, silver, copper, palladium, nickel, and platinum, or a plurality of the elements is formed over a surface of a particle formed from a resin may be used.

Instead of using an anisotropic conductive adhesive material to connect the connection terminals 123 and 124 to the conductive layers 52a and 52b, respectively, they may be connected using a method such as compression of an anisotropic conductive film or reflow treatment using a solder bump. Alternatively, the conductive layer 52a, the conductive particle 126, and the connection terminal 123 may be connected by laser light irradiation. In that case, when a region in which the conductive layer 52a, the conductive particle 126, and the connection terminal 123 overlap is irradiated with a laser light from the insulating layer 53 side, the conductive layer 52a, the conductive particle 126, and the connection terminal 123 are melted by the energy of the laser light and are alloyed. Thus, the conductive layer 52a, the conductive particle 126, and the connection terminal 123 can be electrically connected.

The display device can be manufactured by attaching flexible substrates each having a conductive layer, to each other using a sealing material. As display devices here, there are a liquid crystal display device, a light-emitting display device, an electrophoretic display device, and the like.

Through the above steps, semiconductor devices capable of transmitting and receiving data without contact can be manufactured with a high yield. Further, semiconductor devices with little variation can be manufactured. Furthermore, a semiconductor device can be manufactured through less and safe steps, and therefore cost of a semiconductor device can be reduced.

Embodiment 1

In this embodiment, a step of manufacturing a semiconductor device capable of transmitting and receiving data without contact is described with reference to FIGS. 6A to 11C. In this embodiment, an example is shown in which a semiconductor device is manufactured by attaching an integrated circuit which is formed using a thin film transistor, and an antenna to each other.

Figure 6A:
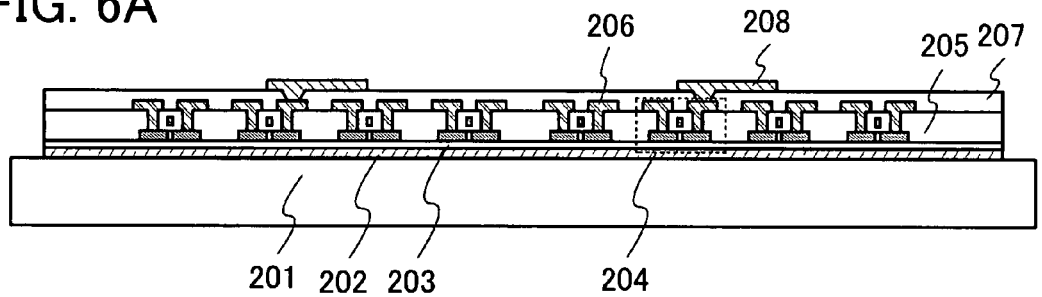
FIGS. 6A to 6E are cross-sectional views showing a step of manufacturing a semiconductor device of the present invention.

As shown in FIG. 6A, a separation layer 202 is formed over a substrate 201, an insulating layer 203 is formed over the separation layer 202, and a thin film transistor 204 and an interlayer insulating layer 205 that insulates a conductive layer forming a thin film transistor are formed over the insulating layer 203. Source and drain electrodes 206 that are connected to a semiconductor layer of the thin film transistor are formed. Then, an insulating layer 207 is formed, which covers the thin film transistor 204, the interlayer insulating layer 205, and the source and drain electrodes 206. A conductive layer 208 that is connected to the source electrode or drain electrode 206 with the insulating layer 207 interposed therebetween is formed.

As the substrate 201, a glass substrate, a quartz substrate, a metal or stainless steel substrate with an insulating layer formed over one surface, a plastic substrate having heat resistance against a treatment temperature of this step, or the like is used. Since the aforementioned substrate 201 is not limited in size or shape, a rectangular substrate with a length of 1 m or more on one side, for example, can be used as the substrate 201 to drastically increase productivity. This point is superior to that of a circular silicon substrate.

The separation layer 202 is formed by a sputtering method, a plasma CVD method, a coating method, a printing method, or the like to be a single layer or a stacked layer made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing any of the elements described above as its main component; or a compound material containing any of the elements described above as its main component. The crystalline structure of a layer containing silicon may be amorphous, microcrystalline, or polycrystalline.

In a case where the separation layer 202 has a single layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of an alloy of tungsten and molybdenum is formed.

In a case where the separation layer 202 has a stacked layer structure, a tungsten layer, a molybdenum layer, or an alloy layer of tungsten and molybdenum is preferably formed as a first layer. Oxide of tungsten, molybdenum, or an alloy of tungsten and molybdenum; nitride of tungsten, molybdenum, or an alloy of tungsten and molybdenum; or oxynitride of tungsten, molybdenum, or an alloy of tungsten and molybdenum is preferably formed as a second layer.

In a case where a stacked layer structure of a layer containing tungsten and a layer containing oxide of tungsten is formed as the separation layer 202, the following may be utilized: the layer containing tungsten is formed, and an insulating layer formed from oxide is formed thereover, and a layer containing oxide of tungsten is formed in an interface between the tungsten layer and the insulating layer. Moreover, the layer containing oxide of tungsten may be formed in such a manner that a surface of the layer containing tungsten is subjected to thermal oxidation treatment, oxygen plasma treatment, $N_2O$ plasma treatment, treatment using a solution having strong oxidizability such as ozone water, or the like. A case of forming a layer containing nitride or oxynitride of tungsten is similar to the above. After forming the layer containing tungsten, a layer containing nitride or a layer containing oxynitride may be formed thereover.

Oxide of tungsten is represented by $WO_x$ where x is in the range of $2 \leq x \leq 3$. The x may be 2 ($WO_2$), 2.5 ($W_2O_5$), 2.75 ($W_4O_{11}$), 3($WO_3$), and the like.

Although the separation layer 202 is formed in contact with the substrate 201 in accordance with the above step, the present invention is not limited to this step. An insulating layer to be a base may be formed so as to be in contact with the substrate 201, and the separation layer 202 may be provided in contact with the insulating layer.

The insulating layer 203 is formed using an inorganic compound by a sputtering method, a plasma CVD method, a coating method, a printing method, or the like to be a single layer or a stacked layer. As a typical example of an inorganic compound, silicon oxide, silicon nitride, or silicon oxynitride can be given.

Moreover, the insulating layer 203 may be formed to have a stacked layer structure. For example, layers may be stacked using an inorganic compound. Typically, two or more layers of silicon oxide, silicon nitride oxide, or silicon oxynitride may be stacked to form the insulating layer 203.

The thin film transistor 204 includes a semiconductor layer having a source region, a drain region, and a channel formation region; a gate insulating layer; and a gate electrode.

The semiconductor layer is a layer formed from a semiconductor having a crystalline structure, and a non-single crystalline semiconductor or a single crystalline semiconductor may be used. In particular, a crystalline semiconductor that is crystallized by heat treatment or a crystalline semiconductor that is crystallized by combining heat treatment and laser light irradiation is preferably applied. In the heat treatment, a crystallization method can be applied using a metal element such as nickel that operates to promote crystallization of a silicon semiconductor. Further, by heating in the crystallization step of the silicon semiconductor, a surface of the separation layer can be oxidized to form a metal oxidized layer at the interface between the separation layer 202 and the insulating layer 203.

In a case where crystallization is performed by laser light irradiation in addition to heat treatment, the crystallization can be performed by using continuous wave laser light or ultra short pulsed laser light with a high repetition rate of 10 MHz or higher and the pulse width of 1 nanosecond or shorter, preferably 1 to 100 picoseconds, in such a way that a melting zone in which the crystalline semiconductor is melted is moved continuously in a direction of the laser light irradiation. By such a crystallization method, a crystalline semiconductor that has a large grain size with a crystal grain boundary extending in one direction can be obtained. By matching a carrier drifting direction to the direction where the crystal grain boundary extends, the electric field effect mobility of the transistor can be increased. For example, a mobility of 400 $cm^2/V \cdot sec$ or higher can be achieved.

In a case where a crystallization step at a heat-resistance temperature (approximately 600° C.) or lower of the glass substrate is used for the above crystallization step, a glass substrate having a large size can be used. Therefore, a large quantity of semiconductor devices can be manufactured per substrate, and cost can be reduced.

Further, the semiconductor layer may be formed by performing a crystallization step by heating at a heat-resistance temperature of the glass substrate or higher. Typically, a quartz substrate is used for the substrate 201, and an amorphous or microcrystalline semiconductor is heated at 700° C. or more, so that the semiconductor layer is formed. As a result, a semiconductor having high crystallinity can be formed. Therefore, a thin film transistor of which properties such as a response speed and mobility are favorable and which is capable of high speed operation can be provided.

The gate insulating layer is formed from an inorganic insulator such as silicon oxide and silicon oxynitride.

The gate electrode can be formed from a polycrystalline semiconductor to which metal or an impurity of one conductivity type is added. In a case of using metal, tungsten (W), molybdenum (Mo), titanium (Ti), tantalum (Ta), aluminum (Al), or the like can be used. Metal nitride formed by nitriding metal may be also used. Alternatively, the gate electrode may have a structure in which a first layer made of the metal nitride and a second layer made of the metal are stacked. In a case of the stacked layer structure, an edge portion of the first layer may be projected beyond an edge portion of the second layer. At this time, by forming the first layer from metal nitride, a barrier metal can be obtained. In other words, the metal of the second layer can be prevented from diffusing into the gate insulating layer or into the semiconductor layer that is provided in the layer below the gate insulating layer.

Various structures such as a single drain structure, an LDD (lightly-doped drain) structure, and a gate-overlapped drain structure can be applied to the thin film transistor that is formed by combining the semiconductor layer, the gate insulating layer, the gate electrode, and the like. Here, a thin film transistor having a single drain structure is employed. Moreover, a multi-gate structure where transistors, to which a gate voltage having the same potential is applied equally are serially connected, a dual-gate structure where the semiconductor layer is sandwiched by the gate electrode, an inversely staggered thin film transistor where the gate electrode is formed over the insulating layer 203 and the gate insulating layer and the semiconductor layer are formed over the gate electrode, or the like can be applied.

The source and drain electrodes 206 are preferably formed by combining a low-resistance material such as aluminum (Al), and a barrier metal using a metal material that has a high melting point such as titanium (Ti) or molybdenum (Mo) to have a stacked layer structure of titanium (Ti) and aluminum (Al), or a stacked layer structure of molybdenum (Mo) and aluminum (Al), or the like.

The interlayer insulating layer 205 and the insulating layer 207 are formed using polyimide, acrylic, or siloxane polymer.

Furthermore, a semiconductor element of any structure may be provided instead of the thin film transistor 204 as long as the semiconductor element can serve as a switching element. As a typical example of the switching element, MIM (Metal-Insulator-Metal), a diode, or the like can be given.

Figure 6B:
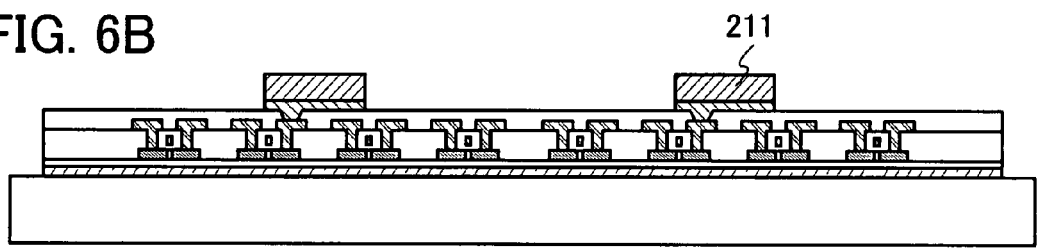

Next, as shown in FIG. 6B, a conductive layer 211 is formed over the conductive layer 208. Here, a composition that contains silver particles is printed by a printing method, and heating is performed for 30 minutes at 200° C. and the composition is baked, so that the conductive layer 211 is formed.

Figure 6C:
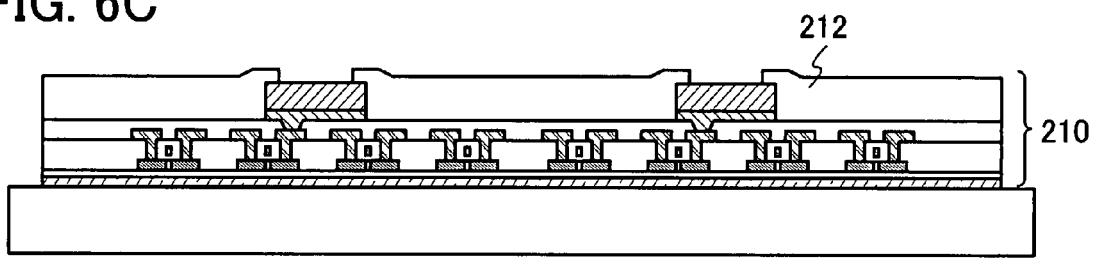

Subsequently, as shown in FIG. 6C, an insulating layer 212 that covers the insulating layer 207 and an edge portion of the conductive layer 211 is formed. Here, an epoxy resin is applied by a spin coating method, and heating is performed for 30 minutes at 160° C. Then, the insulating layer in a portion where the conductive layer 211 is covered is removed to expose the conductive layer 211, and the insulating layer 212 is also formed. Here, a stacked body including the insulating layer 203 to the insulating layer 212 is referred to as an element formation layer 210.

Figure 6D:
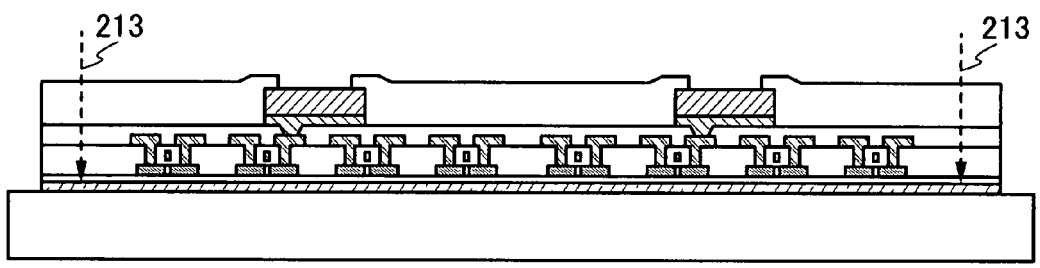
Figure 6E:
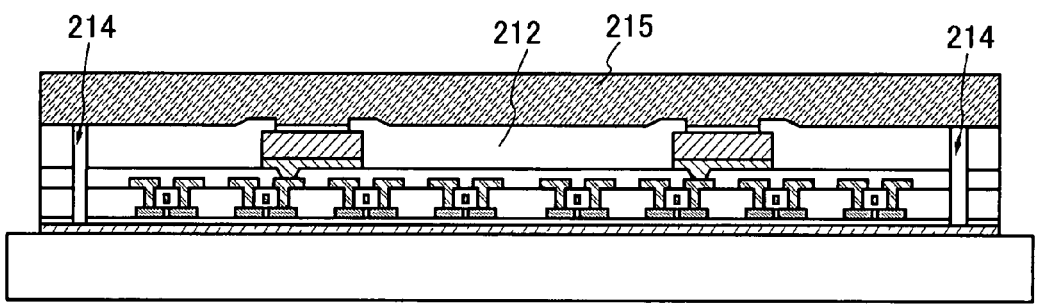

Then, as shown in FIG. 6D, in order to perform a subsequent separating step easily, the insulating layers 203, 205, 207, and 212 are irradiated with a laser light 213 to form an opening 214 as shown in FIG. 6E. Subsequently, a sticky member 215 is attached to the insulating layer 212. As the laser light used for forming the opening 214, laser light having a wavelength that is absorbed by the insulating layers 203, 205, 207, and 212 is preferably used. Typically, laser light in a UV region, a visible region, or an infrared region is appropriately selected for irradiation.

As a laser oscillator capable of oscillating such a laser light, an oscillator of an excimer laser such as an ArF laser, a KrF laser, or a XeCl laser; a gas laser such as a He laser, a He—Cd laser, an Ar laser, a He—Ne laser, a HF laser, or a $CO_2$ laser; a solid laser such as a crystal laser in which a crystal such as $YAG$, $GdVO_4$, $YVO_4$, YLF, or $YAlO_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In the solid laser oscillator, the fundamental wave to the fifth harmonic wave may be appropriately used. As a result, the insulating layers 203, 205, 207, and 212 absorbs a laser light to be melted, whereby the opening is formed.

By eliminating the step of irradiating the insulating layers 203, 205, 207, and 212 with a laser light, throughput can be improved.

Figure 7A:
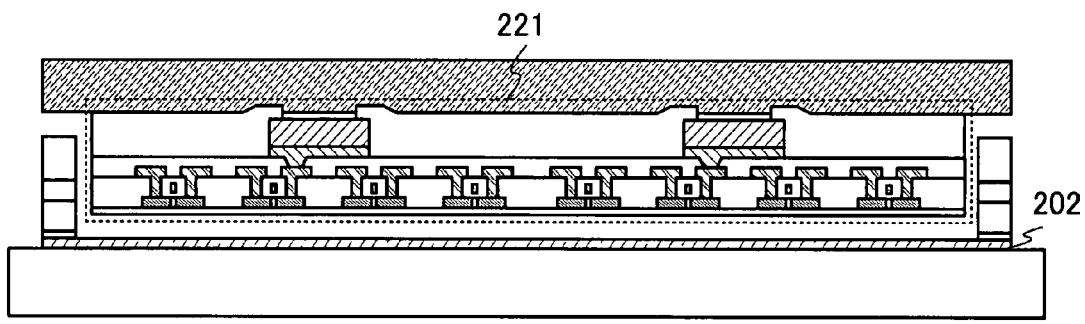
FIGS. 7A to 7D are cross-sectional views showing a step of manufacturing a semiconductor device of the present invention.

Next, as shown in FIG. 7A, a part 221 of the element formation layer is separated from the substrate 201 having the separation layer by a physical means at a metal oxide layer formed at the interface between the separation layer 202 and the insulating layer 203. The physical means refers to a dynamic means or a mechanical means, which changes some dynamic energy (mechanical energy). The typical physical means refers to mechanical power addition (for example, separating by a human hand or grip tool, or division treatment by rolling a roller).

In this embodiment, a method in which the metal oxide film is formed between the separation layer and the insulating layer, and the element formation layer 210 is separated by a physical means by dividing the metal oxide film, is used; however, the present invention is not limited thereto. A method can be used, in which, by using a substrate that has a light-transmitting property for the substrate and using an amorphous silicon layer containing hydrogen for the separation layer, irradiation with a laser light from a substrate side is performed to vaporize hydrogen contained in the amorphous silicon film after the step of FIG. 6E, and separating between the substrate and the separation layer is performed.

Further, after the step of FIG. 6E, a method for removing the substrate by mechanically grinding the substrate or a method for removing the substrate using a solution that dissolves a substrate, such as HF, can be used. In this case, the separation layer may be unused.

In FIG. 6E, the following method can be used: a halogen fluoride gas such as $NF_3$, $BrF_3$, or $ClF_3$ is introduced into the opening 214 before attaching the sticky member 215 to the insulating layer 212, the separation layer is etched with a halogen fluoride gas, then the sticky member 215 is attached to the insulating layer 212 and the element formation layer 210 is separated from the substrate.

In FIG. 6E, the following method can be also used: a halogen fluoride gas such as $NF_3$, $BrF_3$, or $ClF_3$ is introduced into the opening 214 before attaching the sticky member 215 to the insulating layer 212, part of the separation layer is etched with a halogen fluoride gas, then the sticky member 215 is attached to the insulating layer 212 and the element formation layer 210 is separated from the substrate by a physical means.

Next, as shown in FIG. 7A, the part 221 of the element formation layer is separated from the separation layer 202.

Figure 7B:
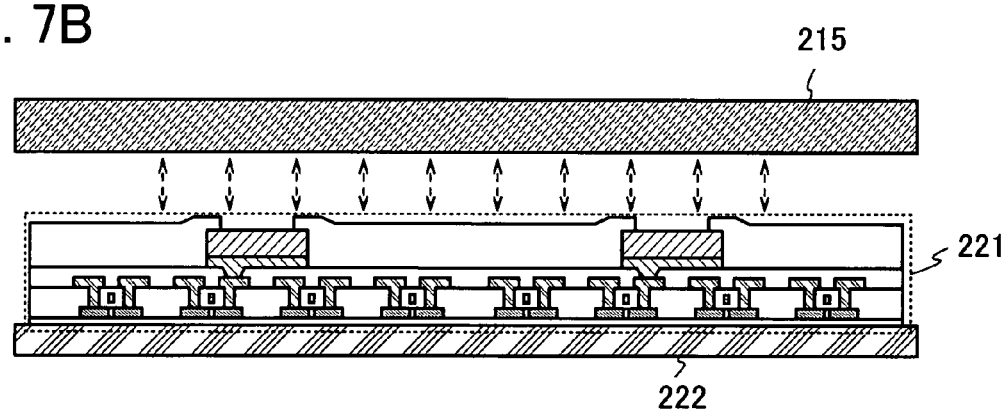

Subsequently, as shown in FIG. 7B, a flexible substrate 222 is attached to the insulating layer 203 in the part 221 of the element formation layer. Subsequently, the sticky member 215 is separated from the part 221 of the element formation layer.

Figure 7C:
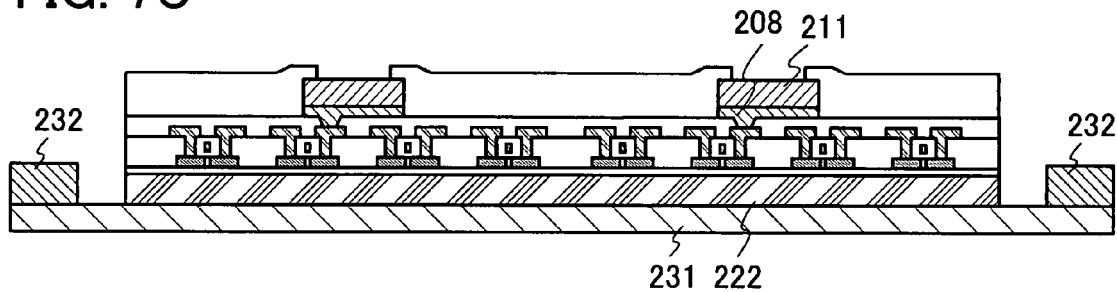

Then, as shown in FIG. 7C, the flexible substrate 222 is attached to a UV tape 231 of a dicing frame 232. Since the UV tape 231 is sticky, the flexible substrate 222 is fixed over the UV tape 231. Subsequently, the conductive layer 211 may be irradiated with a laser light to enhance adhesion between the conductive layer 211 and the conductive layer 208.

Figure 7D:
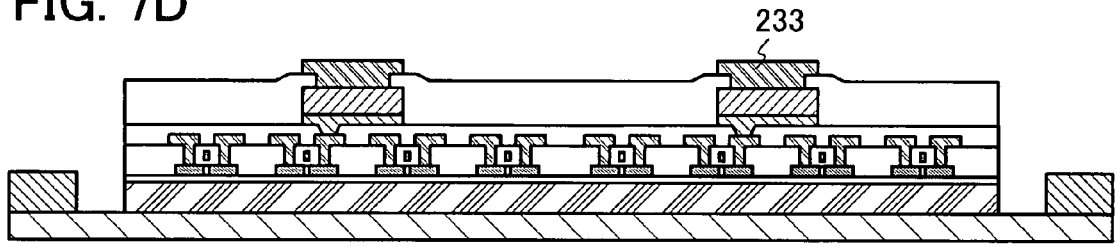

Subsequently, as shown in FIG. 7D, a connection terminal 233 is formed over the conductive layer 211. By forming the connection terminal 233, alignment with and adhesion to a conductive layer serving as an antenna afterwards can be easily performed.

Figure 8A:
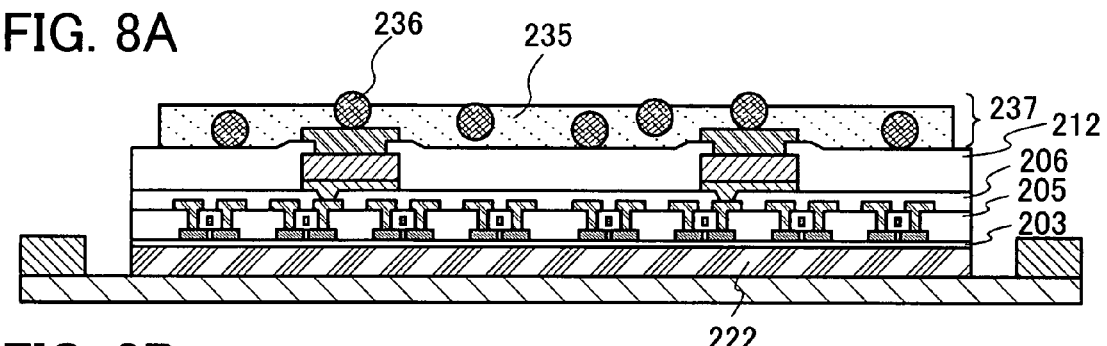
FIGS. 8A to 8D are cross-sectional views showing a step of manufacturing a semiconductor device of the present invention.

Next, as shown in FIG. 8A, an anisotropic conductive adhesive material or an anisotropic conductive film are provided over the insulating layer 212 and the connection terminal 233. Here, an anisotropic conductive adhesive material 237 in which conductive particles 236 are dispersed in an organic resin 235 is provided.

Figure 8B:
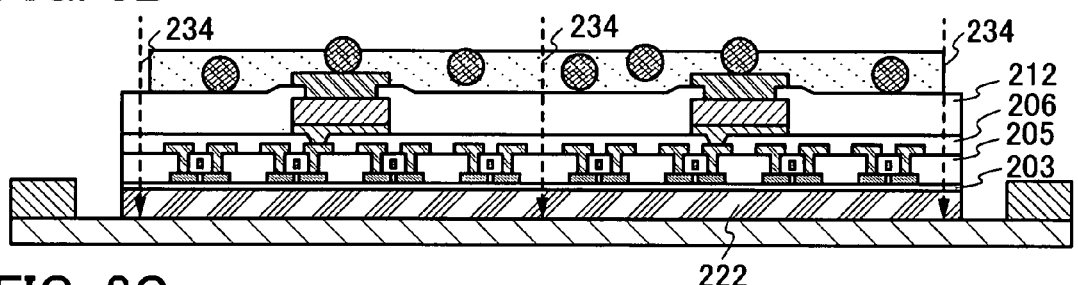
Figure 8C:
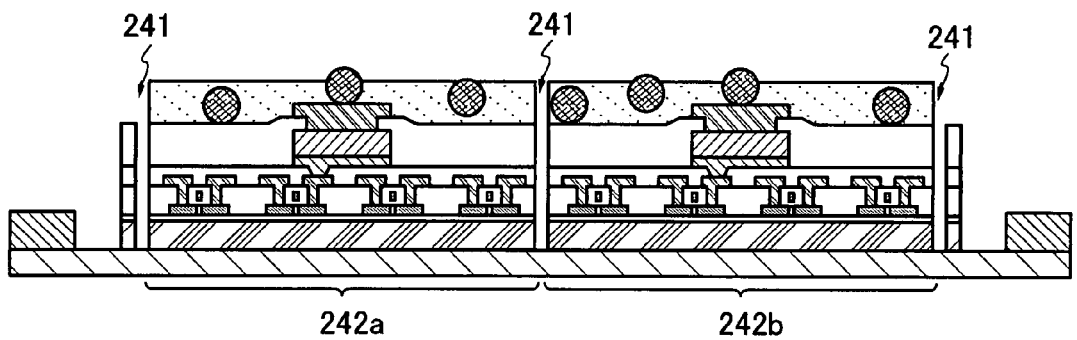

The part 221 of the element formation layer is divided. Here, the anisotropic conductive adhesive material 237, the part 221 of the element formation layer, and the flexible substrate 222 are irradiated with a laser light 234 as shown in FIG. 8B. Thus, a groove 241 as shown in FIG. 8C is formed, and the part 221 of the element formation layer is divided into plural parts. As the laser light 234, the laser light described for the laser light 213 can be applied by being appropriately selected. Laser light that can be absorbed by the insulating layers 203, 205, 207, and 212 and the flexible substrate 222 is preferably selected. Although the part of the element formation layer is divided into plural parts by a laser cut method here, a dicing method, a scribing method, or the like can be appropriately used instead of this method. The element formation layers that are divided thus are referred to as thin film integrated circuits 242a and 242b.

Figure 8D:
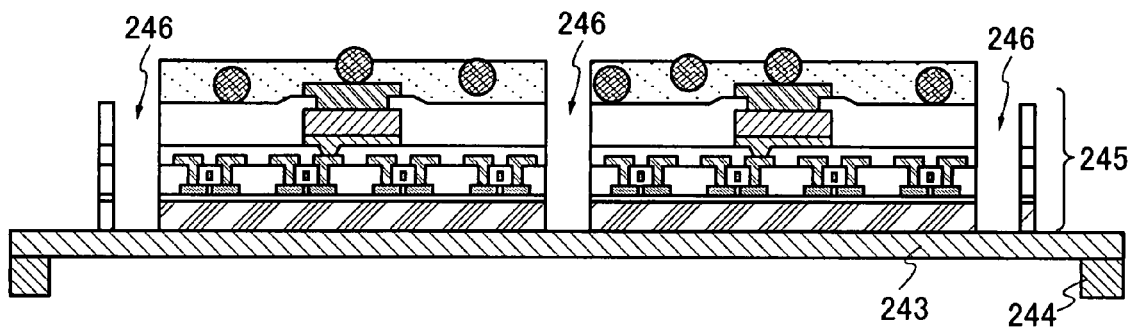

Subsequently, as shown in FIG. 8D, a UV sheet of the dicing frame 232 is irradiated with a UV light to lower the sticking property of the UV sheet, and then, the thin film integrated circuits 242a and 242b are attached to a sticky sheet 243 of an expander frame 244. At this time, the thin film integrated circuits 242a and 242b are attached to the sticky sheet 243 while the sticky sheet 243 is extended, whereby the width of the groove 241 formed between the thin film integrated circuits 242a and 242b can be expanded. It is to be noted that an expanded groove 246 preferably corresponds to the size of an antenna substrate attached to the thin film integrated circuits 242a and 242b in a subsequent step.

Figure 9A:
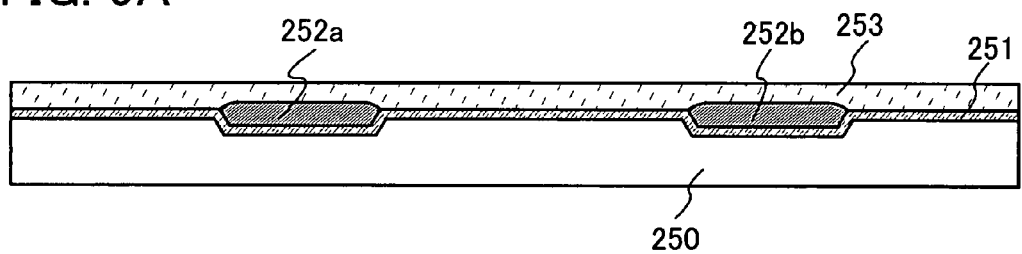
FIGS. 9A to 9D are cross-sectional views showing a step of manufacturing a semiconductor device of the present invention.

Next, a flexible substrate having a conductive layer serving as an antenna is manufactured. First, as shown in FIG. 9A, a layer 251 in which oxygen and silicon are bonded and an inactive group is bonded to the silicon is formed, as a separation layer, using a silane coupling agent over a substrate 250 having depressed portions. Then, conductive layers 252a and 252b serving as antennas are formed over the layer 251 in which oxygen and silicon are bonded and an inactive group is bonded to the silicon, and an insulating layer 253 that covers the conductive layers 252a and 252b is formed.

Here, a glass substrate is used as the substrate 250, and fluoroalkylsilane is used for the layer 251 in which oxygen and silicon are bonded and an inactive group is bonded to the silicon. The substrate 250 is heated for 10 minutes at 170° C. to evaporate fluoroalkylsilane onto a surface of the substrate, and then, washing is performed with ethanol and pure water to form a layer in which oxygen and silicon are bonded and an inactive group is bonded to the silicon with a thickness of several nm to several tens of nm. As the conductive layers 252a and 252b, a composition that contains silver particles is applied by a printing method, and heating and baking are performed at 300° C. for 30 minutes to form a conductive layer with a thickness of 30 μm. As the insulating layer 253, an epoxy resin is applied by a printing method, and the resin is heated and baked at 160° C. for 30 minutes to form the insulating layer 253 with a thickness of 30 μm.

Figure 11A:
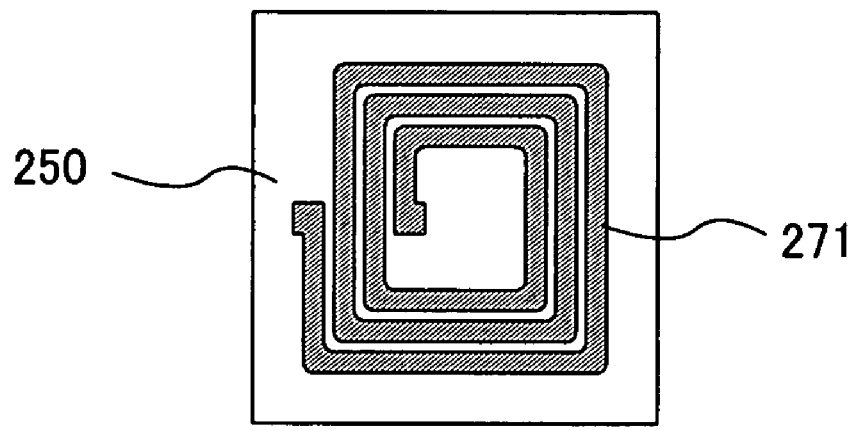
FIGS. 11A to 11C are top views each showing a structure of an antenna capable of being applied to the present invention.
Figure 11B:
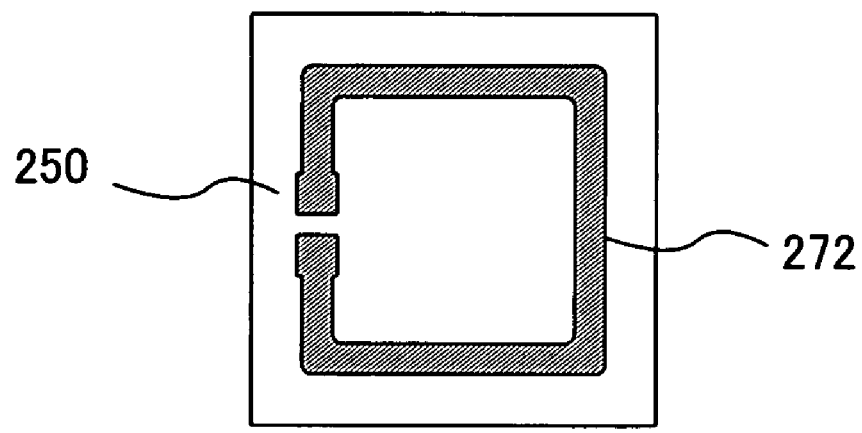

As a shape of the conductive layer serving as an antenna at this time, in a case where an electromagnetic coupling system or an electromagnetic induction system (for example, a frequency of 13.56 MHz) is used as a transmission and reception system of a signal in a semiconductor device, electromagnetic induction due to the change of magnetic field density is utilized; therefore, the conductive layer serving as an antenna can be formed to have a square coil shape 271 as shown in FIG. 11A or a circular coil shape (for example, a spiral antenna). Further, the conductive layer serving as an antenna can be formed to have a square loop shape 272 as shown in FIG. 11B or a circular loop shape.

Figure 11C:
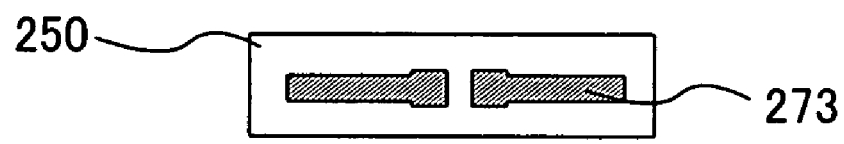

In a case where a microwave system (for example, the UHF band (a frequency of 860 to 960 MHz) or a frequency of 2.45 GHz) is used, the shape such as the length of the conductive layer serving as an antenna may be appropriately set in consideration of the wavelength of an electromagnetic wave used for the transmission and reception of the signal. The conductive layer serving as an antenna can be formed to have a line dipole shape 273 as shown in FIG. 11C, a curved dipole shape, or a planar shape (for example, a patch antenna).

Figure 9B:
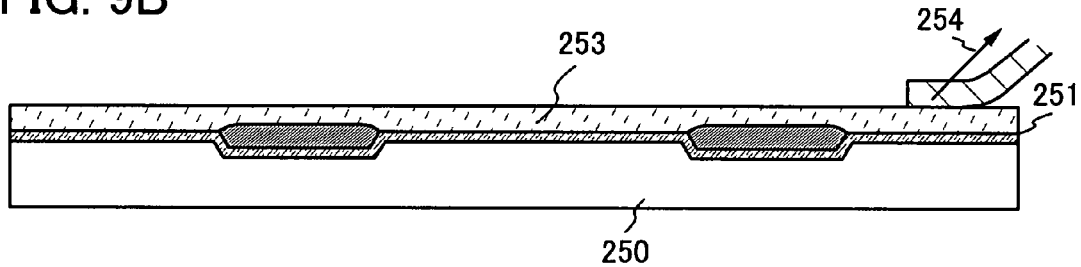
Figure 9C:
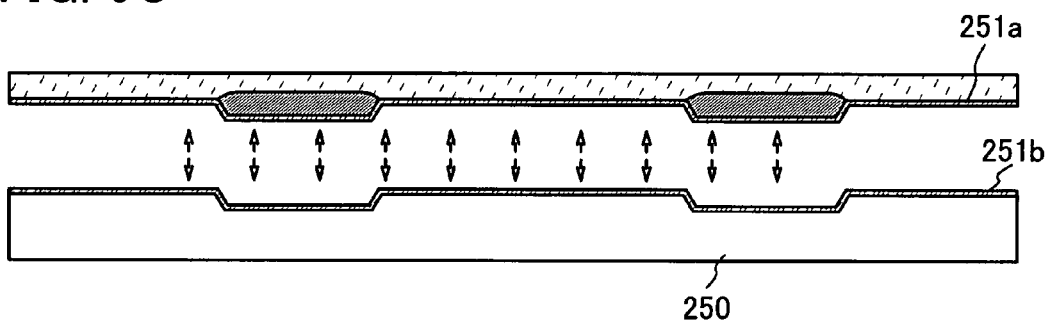

Next, as shown in FIG. 9B, a sticky member 254 is attached to the insulating layer 253, and then, the sticky member 254 is pulled up toward a direction indicated by an arrow. As a result, as shown in FIG. 9C, the layer in which oxygen and silicon are bonded and an inactive group is bonded to the silicon is divided, and the conductive layers 252a and 252b and the insulating layer 253 are separated from the substrate 250. At this time, a part 251b of the layer in which oxygen and silicon are bonded and an inactive group is bonded to the silicon remains over the substrate 250, and a part 251a of the layer in which oxygen and silicon are bonded and an inactive group is bonded to the silicon remains over a surface of the conductive layers 252a and 252b and the insulating layer 253.

Figure 9D:
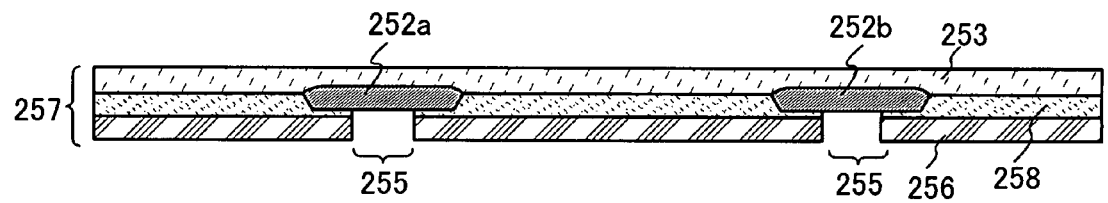

Then, as shown in FIG. 9D, the part of the layer in which oxygen and silicon are bonded and an inactive group is bonded to the silicon that remains over a surface of the conductive layers 252a and 252b and the insulating layer 253 is removed, and then a flexible substrate 256 where openings 255 are formed, and the conductive layers 252a and 252b and the insulating layer 253 are attached to each other with an adhesive material 258. At this time, alignment of the flexible substrate 256 and the conductive layers 252a and 252b is performed so as to expose part of the conductive layers 252a and 252b through the openings 255.

Through the above steps, a flexible substrate 257 that has the conductive layers 252a and 252b serving as antennas is formed.

Figure 10A:
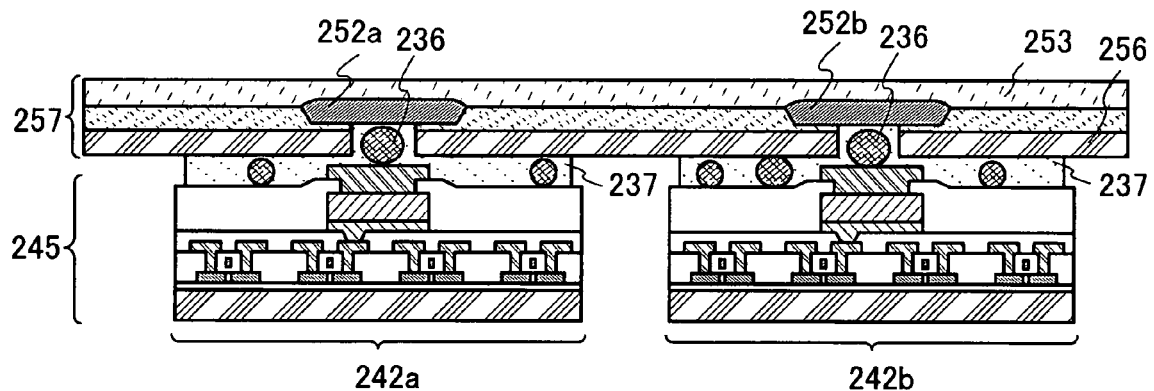
FIGS. 10A to 10D are cross-sectional views showing a step of manufacturing a semiconductor device of the present invention.

Next, as shown in FIG. 10A, the flexible substrate 257 that has the conductive layers 252a and 252b serving as antennas, and the thin film integrated circuits 242a and 242b are attached to each other with the anisotropic conductive adhesive materials 237. At this time, attachment is performed while aligning so as to connect the conductive layers 252a and 252b serving as antennas to the connection terminal of the thin film integrated circuits 242a and 242b with the conductive particles 236 contained in the anisotropic conductive adhesive materials 237.

Figure 10B:
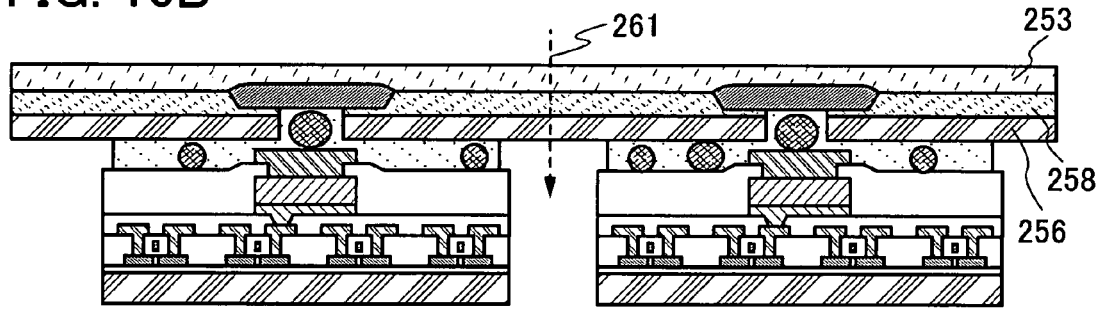

Subsequently, as shown in FIG. 10B, division is performed at a region where the conductive layers 252a and 252b serving as antennas and the thin film integrated circuits 242a and 242b are not formed. Here, division is performed by a laser cut method in which the insulating layer 253, the adhesive material 258, and the flexible substrate 256 are irradiated with a laser light 261.

Figure 10C:
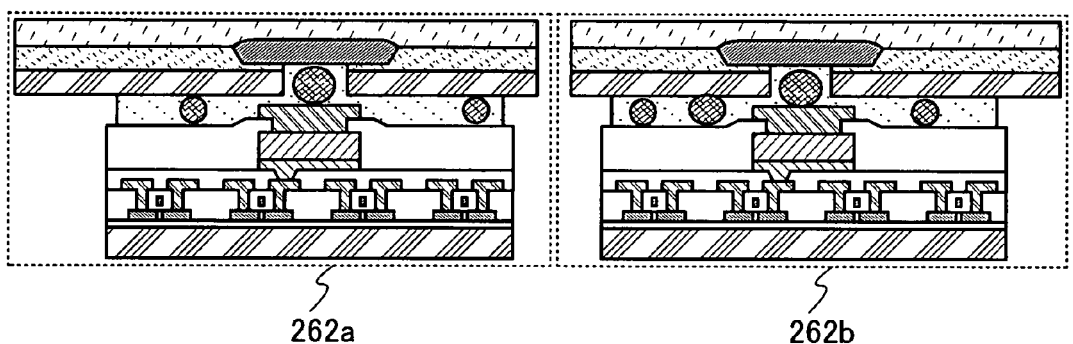

Through the above steps, as shown in FIG. 10C, semiconductor devices 262a and 262b capable of transmitting and receiving data without contact can be manufactured.

Figure 10D:
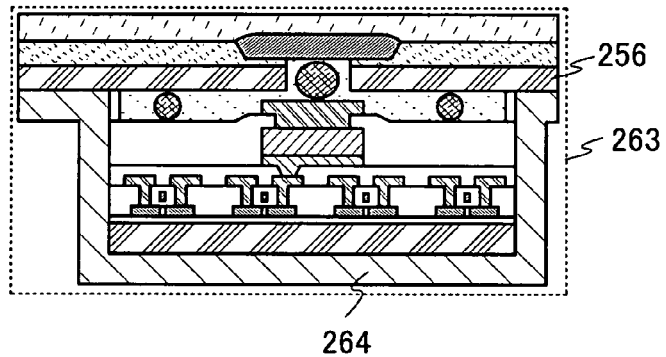

It is to be noted that the following step may be performed: the flexible substrate 256 that has the conductive layers 252a and 252b serving as antennas, and the thin film integrated circuits 242a and 242b are attached to each other with the anisotropic conductive adhesive materials 255a and 255b as shown in FIG. 10A; a flexible substrate is provided to seal the flexible substrate 256 and the thin film integrated circuits 242a and 242b; the region where the conductive layers 252a and 252b serving as antennas and the thin film integrated circuits 242a and 242b are not formed is irradiated with the laser light 261 as shown in FIG. 10B; and a semiconductor device 263 as shown in FIG. 10D is manufactured. In this case, the thin film integrated circuit is sealed by the flexible substrate 256 and a flexible substrate 264 that are divided, whereby deterioration of the thin film integrated circuit can be suppressed.

Through the above steps, semiconductor devices that are thin and lightweight can be manufactured with a high yield. Further, a semiconductor device with little variation can be manufactured. Furthermore, a semiconductor device can be manufactured through less and safe steps.

Embodiment 2

Figure 13:
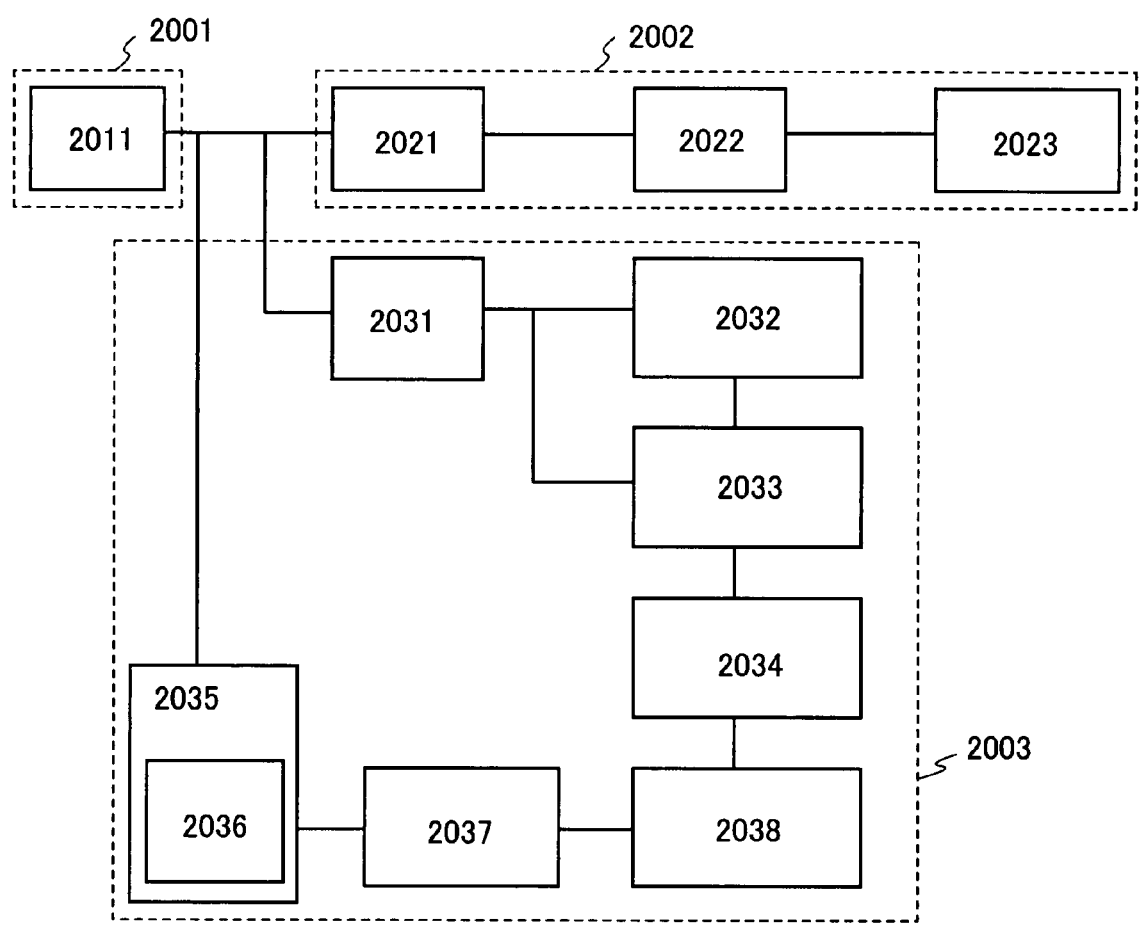
FIG. 13 is a diagram showing a configuration of a semiconductor device of the present invention.

A structure of the semiconductor device capable of transmitting and receiving data without contact of the above embodiment is described with reference to FIG. 13.

A semiconductor device of this embodiment mainly includes an antenna portion 2001, a power supply portion 2002, and a logic portion 2003.

The antenna portion 2001 is made of an antenna 2011 for receiving an external signal and transmitting data. As for a signal transmission and reception system in the semiconductor device, an electromagnetic coupling system, an electromagnetic induction system, a microwave system, or the like can be used. The transmission and reception system may be appropriately selected by a practitioner in consideration of the intended use. The most suitable antenna may be provided in accordance with the transmission and reception system.

The power supply portion 2002 is made of a rectification circuit 2021 that produces power by a signal received from an external portion through the antenna 2011, a storage capacitor 2022 that stores the produced power, and a constant voltage circuit 2023 that produces a constant voltage that is supplied to each circuit.

The logic portion 2003 includes a demodulation circuit 2031 that demodulates a received signal, a clock generation and compensation circuit 2032 that generates a clock signal, a code recognition and determination circuit 2033, a memory controller 2034 that produces a signal for reading data from a memory by the received signal, a modulation circuit 2035 that transmits an encoded signal to the received signal, an encoding circuit 2037 that encodes data that is read, and a mask ROM 2038 that stores data. It is to be noted that the modulation circuit 2035 includes a modulation resistor 2036.

As a code that is recognized and determined by the code recognition and determination circuit 2033, an end of frame (EOF) signal, a start of frame (SOF) signal, a flag, a command code, a mask length, a mask value, and the like can be given. Further, the code recognition and determination circuit 2033 includes a cyclic redundancy check (CRC) function of identifying a transmission error.

In the semiconductor device of this embodiment, antennas with little variation in inductance among a plurality of antennas that are concurrently formed can be used. In addition, an antenna having high electromotive force can be used. As a result, semiconductor devices with little variation can be manufactured. Further, by using a conductive layer formed over a flexible substrate, formation of a semiconductor device that is small-sized, thin, and lightweight can be achieved. Furthermore, a semiconductor device can be manufactured through less and safe steps.

Embodiment 3

A semiconductor device capable of transmitting and receiving data without contact of the present invention can be used by being provided in, for example, paper money, coins, securities, certificates, bearer bonds, packing containers, books, recording media, personal items, vehicles, food items, clothes, healthcare items, livingwares, medicals, electronic devices, or the like. Examples thereof are described with reference to FIGS. 14A to 15C.

Figure 14A:
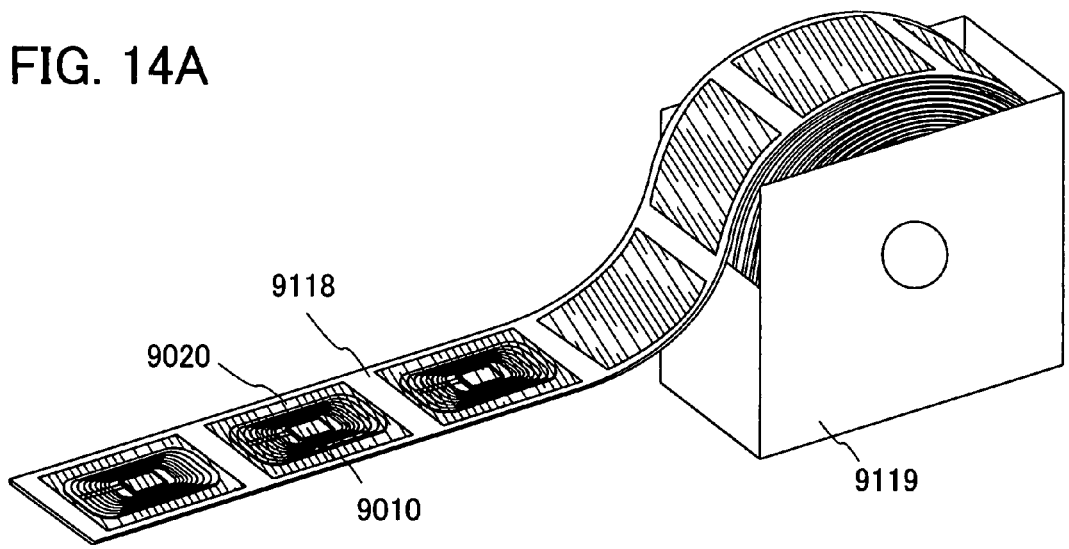
FIGS. 14A to 14E are views each showing an application example of a semiconductor device of the present invention.

FIG. 14A shows an example of a state of completed products of labels with a built-in semiconductor device 9010 according to the present invention. On a label board (separate paper) 9118, labels 9020 with built-in semiconductor devices 9010 are formed. The labels 9020 are put in a box 9119. In addition, on the label, information on a commercial product or service (for example, a name of the product, a brand, a trademark, a trademark owner, a seller, a manufacturer, and the like) is written, while an ID number that is unique to the commercial product (or the kind of the commercial product) is assigned to the semiconductor device 9010 to make it possible to easily figure out forgery, infringement of intellectual property rights such as a patent and a trademark, and illegality such as unfair competition. In addition, a lot of information that is too much to write clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product, and the like can be input in the semiconductor device 9010 so that a transactor and a consumer can access the information using a simple reader. While rewriting, deleting, and the like of the information can be conducted by the producer, a transactor or consumer is not allowed to conduct rewriting, deleting, and the like of the information.

Figure 14B:
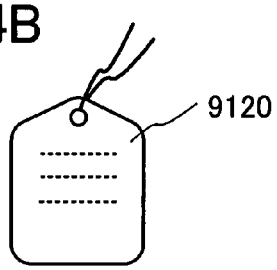

FIG. 14B shows a tag 9120 with a built-in semiconductor device. By mounting the tag with a built-in semiconductor device on commercial products, the management of the commercial products becomes easier. For example, in the case where the commercial product is stolen, the thief can be figured out quickly by tracing the pathway of the commercial product. In this way, by providing the tag with a built-in semiconductor device, commercial products that are superior in so-called traceability (traceability means that preparation is made for smoothly grasping the cause of a problem, which may occur at each complicated stage of manufacture and distribution, by tracing the pathway) can be distributed.

Figure 14C:
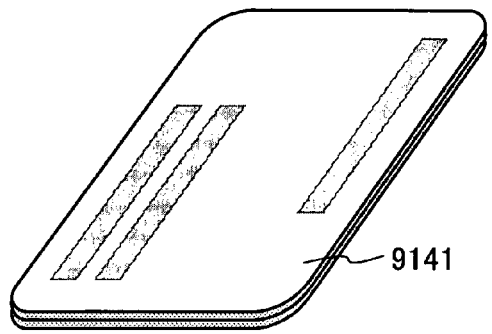

FIG. 14C shows an example of a state of a completed product of an ID card 9141 with a built-in semiconductor device according to the present invention. The ID card includes all kinds of cards such as a cash card, a credit card, a prepaid card, an electronic ticket, electronic money, a telephone card, and a membership card.

Figure 14D:
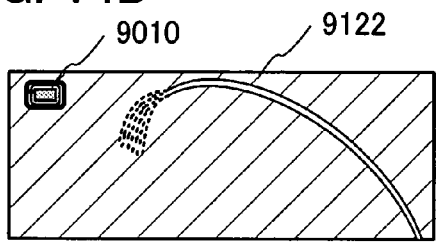

FIG. 14D shows an example of a state of a completed product of a bearer bond 9122 with the built-in semiconductor device 9010 according to the present invention. The bearer bonds include, but not limited to of course, stamps, tickets, admission tickets, merchandise coupons, book coupons, stationery coupons, beer coupons, rice coupons, various gift coupons, and various service coupons. In addition, a semiconductor device of the present invention can be provided in securities such as a check, a certificate, and a promissory note, certificates such as a driving license and a resident card, or the like, not limited to bearer bonds.

Figure 14E:
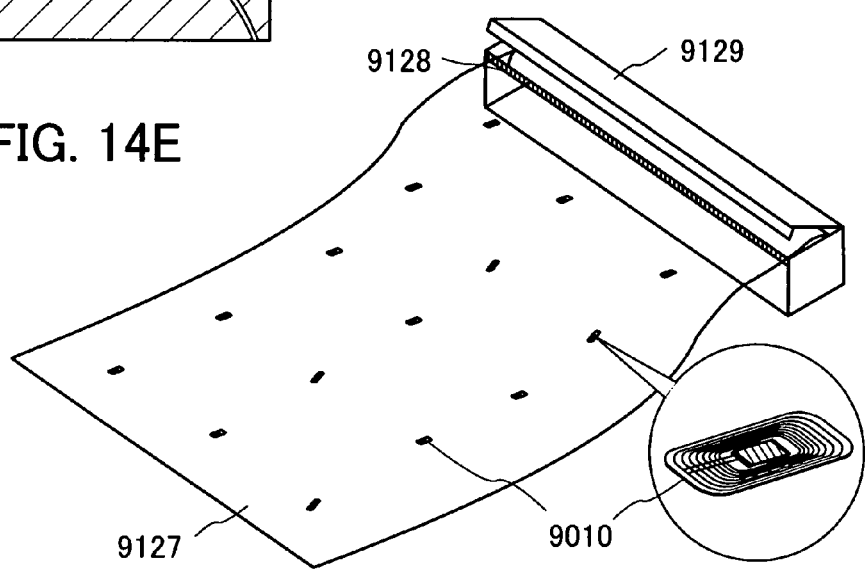

FIG. 14E shows a wrapping film 9127 with a built-in semiconductor device 9010, for wrapping a commercial product. The wrapping film 9127 can be manufactured, for example, by scattering semiconductor devices 9010 arbitrarily on a lower film and covering them with an upper film. The wrapping film 9127 is put in a box 9129, and the desired amount of film can be cut away with a cutter 9128 and used. The material of the wrapping film 9127 is not particularly limited. For example, materials such as a thin film resin, an aluminum foil, and paper can be used.

Figure 15A:
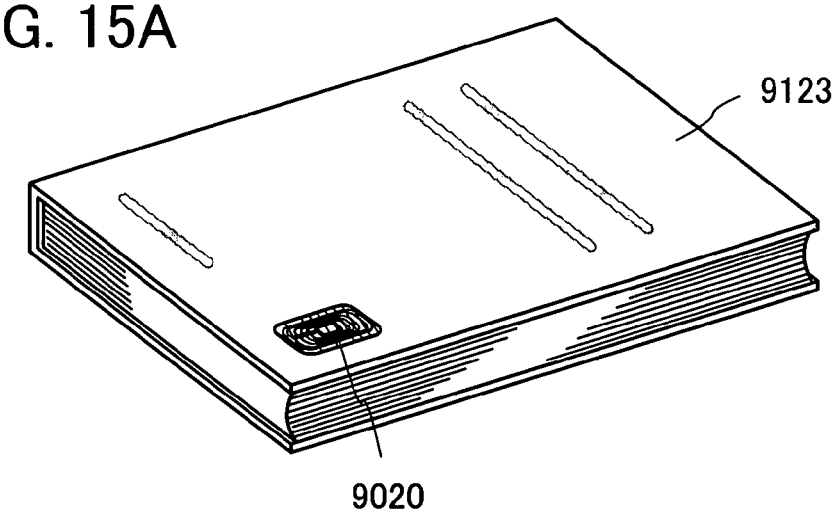
FIGS. 15A to 15C are views each showing an application example of a semiconductor device of the present invention.
Figure 15B:
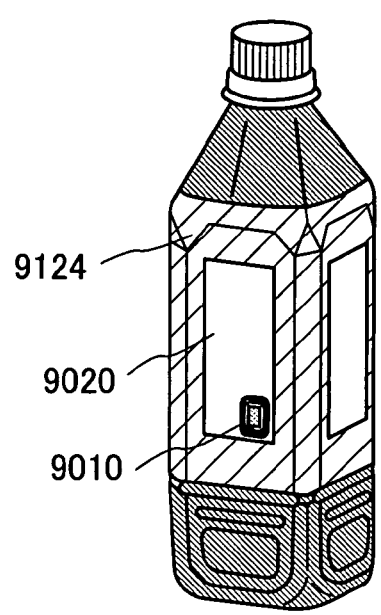

FIGS. 15A and 15B respectively show a book 9123 and a plastic bottle 9124 to which a label 9020 with a built-in semiconductor device 9010 according to the present invention is attached. It is to be noted that the goods are not limited to these and the ID label may be attached to various goods such as containers for packages such as paper for packing a box lunch; recording media such as DVD software and a video tape; vehicles including a wheeled vehicle such as a bicycle and a vessel; personal belongings such as a bag and glasses; foods such as food items and beverages; clothes such as clothing and footwear; healthcare items such as a medical device and a health appliance; livingware such as furniture and a lighting apparatus; medicals such as a medicine and an agricultural chemical; electronic devices such as a liquid crystal display device, an EL display device, a television set (a television receiver, a thin television receiver), and a mobile phone. The semiconductor device that is used in the present invention is quite thin, therefore, when the label is mounted on goods such as the book, the function or design is not damaged. Furthermore, in the case of a semiconductor device of the present invention, an antenna and a chip can be formed in an integrated manner to make it easier to transfer the semiconductor device of the present invention directly to a commercial product with a curved surface.

Figure 15C:
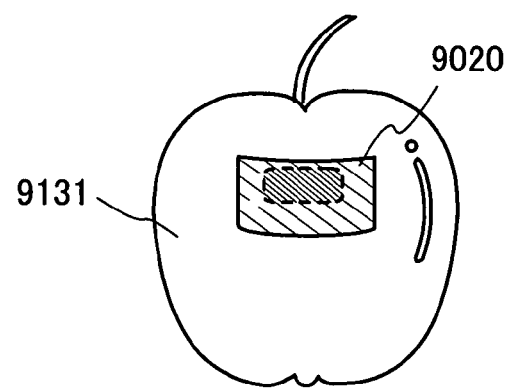

FIG. 15C shows a state in which the label 9020 is directly attached to fresh food such as fruits 9131. When a label is attached to a commercial product, probably, the label is peeled off. However, when the commercial product is wrapped in wrapping films, it is difficult to peel off the wrapping film, which brings some merit for security.

When a semiconductor device of the present invention is provided in bills, coins, securities, certificates, bearer bonds, and the like, forgery of them can be prevented. When a semiconductor device of the present invention is provided in containers for packages, books, recording media, personal belongings, foods, livingware, electronic devices, and the like, inspection systems, rental systems, and the like can be performed more efficiently. When a semiconductor device of the present invention is provided in vehicles, healthcare items, medicals, and the like, forgery and theft thereof can be prevented and medicines can be prevented from being taken in the wrong manner.

In this manner, when a semiconductor device of the present invention is provided in containers for packages, recording media, personal belongings, foods, clothes, livingware, electronic devices, and the like, inspection system, rental system, and the like can be performed more efficiently. Further, when a semiconductor device of the present invention is provided in vehicles, forgery and theft thereof can be prevented.

As described above, a semiconductor device of the present invention can be used for any product. Since a semiconductor device of the present invention is thinner and more bendable, a user can use naturally a product with the semiconductor device attached. Note that this embodiment mode can be freely combined with the other embodiment modes and embodiments.

Embodiment 4

Figure 16:
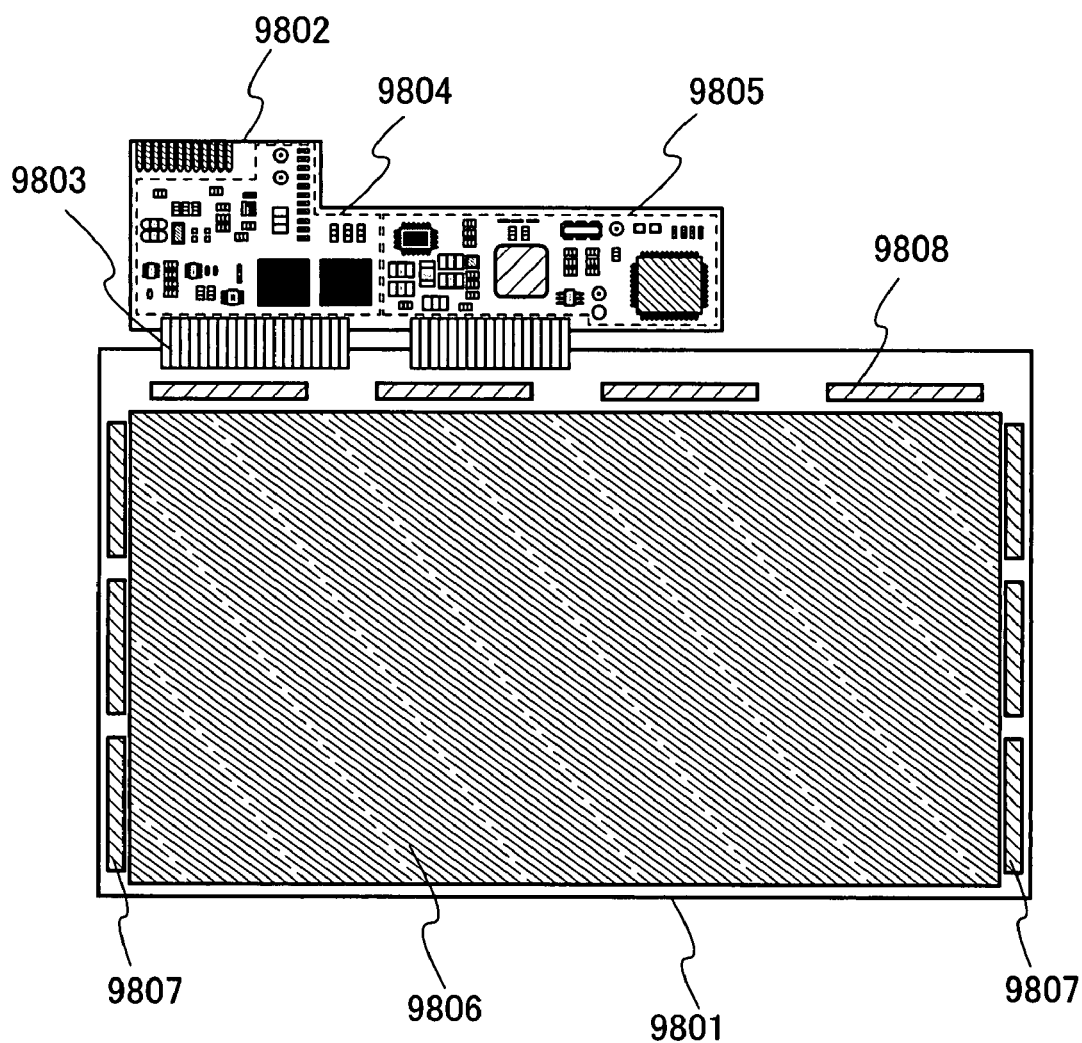
FIG. 16 is a view showing an electronic device having a semiconductor device of the present invention.

In this embodiment, as an example of a semiconductor device using a flexible substrate having a pixel electrode manufactured in the above-described embodiment modes, a display module is described with reference to FIG. 16. FIG. 16 shows a module including a display panel 9801 and a circuit board 9802. For example, a control circuit 9804, a signal division circuit 9805, and the like are mounted on the circuit board 9802. The display panel 9801 is connected to the circuit board 9802 through an FPC 9803. As the display panel 9801, the liquid crystal panel, the light-emitting display panel, the electrophoretic display panel, and the like may be used as appropriate.

The display panel 9801 has a pixel portion 9806, a scanning line driver circuit 9807, and a signal line driver circuit 9808 that supplies a video signal to a selected pixel. A substrate over which a pixel electrode of the pixel portion 9806 is formed can be manufactured by the method described in the above-described embodiment modes. Further, the FPC 9803 can be manufactured by the method described in the above-described embodiment modes. As the scanning line driver circuit 9807 and the signal line driver circuit 9808, the scanning line driver circuit 9807 and the signal line driver circuit 9808 including IC chips are mounted on the substrate by a method such as a mounting method using an anisotropic conductive adhesive material or an anisotropic conductive film, a COG method, a wire bonding method, reflow treatment using a solder bump, or the like.

By this embodiment, modules having display panels can be manufactured with a high yield. Further, semiconductor devices with little variation can be manufactured.

Embodiment 5

As an electronic device having the semiconductor device shown in the above-described embodiment modes and embodiments, a television device (also referred to as simply TV or a television receiver), a camera such as a digital camera or a digital video camera, a cellular phone device (also referred to as simply cellular phone set or cellular phone), a portable information terminal such as a PDA, a monitor for a computer, a computer, an audio reproducing device such as a car audio component or a digital player, an image reproduction device provided with a recording medium such as a home game machine, and the like can be given. Specific examples thereof are described with reference to FIGS. 17A to 17F.

Figure 17A:
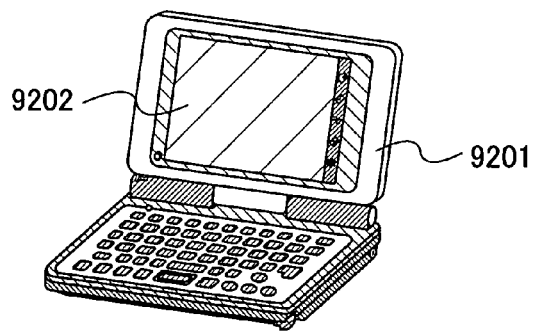
FIGS. 17A to 17F are views each showing an electronic device having a semiconductor device of the present invention.

A portable information terminal shown in FIG. 17A includes a main body 9201, a display portion 9202, and the like. A module having a display panel using the flexible substrate shown in the above-described embodiments can be applied to the display portion 9202. By using the semiconductor device as one aspect of the present invention, a lightweight, small-sized, and portable information terminal can be provided.

Figure 17B:
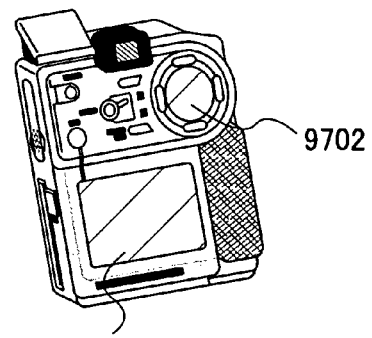

A digital video camera shown in FIG. 17B includes a display portion 9701, a display portion 9702, and the like. A module having a display panel using the flexible substrate shown in the above-described embodiments can be applied to the display portion 9701. By using the semiconductor device as one aspect of the present invention, a small-sized digital video camera can be provided.

Figure 17C:
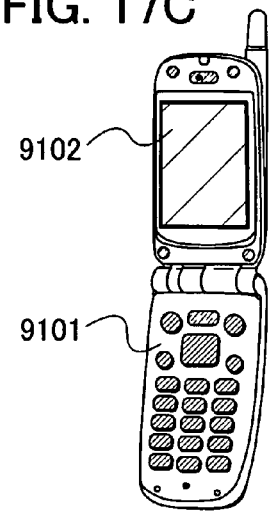

A portable terminal shown in FIG. 17C includes a main body 9101, a display portion 9102, and the like. A module having a display panel using the flexible substrate shown in the above-described embodiments can be applied to the display portion 9102. By using the semiconductor device as one aspect of the present invention, a small-sized and portable terminal can be provided.

Figure 17D:
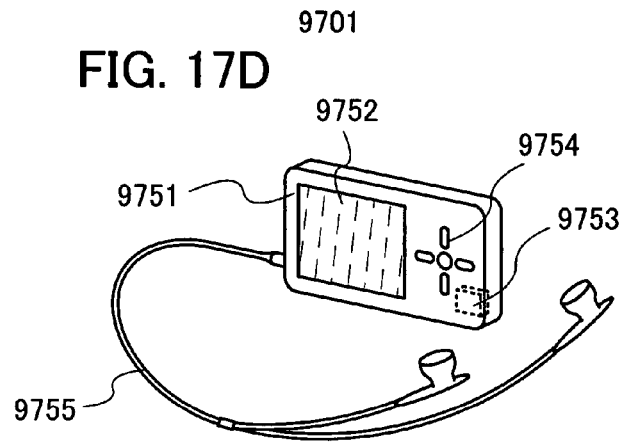

A digital player shown in FIG. 17D includes a main body 9751, a display portion 9752, a memory portion 9753, an operation portion 9754, an earphone 9755, and the like. A module having a display panel using the flexible substrate shown in the above-described embodiments can be applied to the display portion 9752. Note that a headphone or a wireless earphone can be used instead of the earphone 9755. Note that power consumption can be suppressed by the display portion 9752 displaying white text on a black background. This is particularly effective in a portable audio device. By using the semiconductor device as one aspect of the present invention, a lightweight, small-sized, and portable digital player can be provided.

Figure 17E:
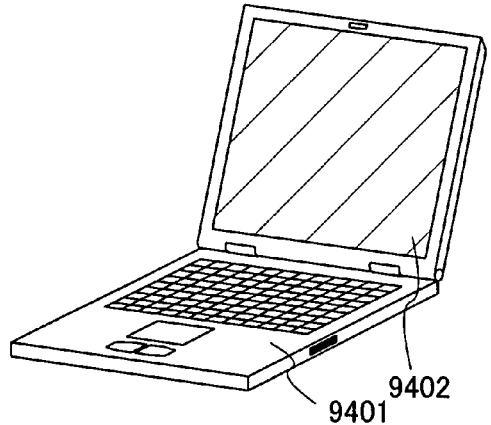

A portable computer shown in FIG. 17E includes a main body 9401, a display portion 9402, and the like. A module having a display panel using the flexible substrate shown in the above-described embodiments can be applied to the display portion 9402. By using the semiconductor device as one aspect of the present invention, a lightweight, small-sized, and portable computer can be provided.

Figure 17F:
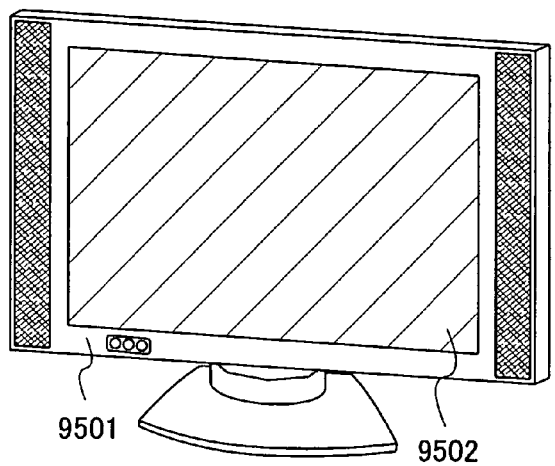

A television device shown in FIG. 17F includes a main body 9501, a display portion 9502, and the like. A module having a display panel using the flexible substrate shown in the above-described embodiments can be applied to the display portion 9502. By using the semiconductor device as one aspect of the present invention, a thin television device can be provided.

This application is based on Japanese Patent Application serial No. 2006-266264 filed in Japan Patent Office on Sep. 29, 2006, the entire contents of which are hereby incorporated by reference.

What is claimed is:

1. A method for forming a conductive layer comprising the steps of:
    forming a layer comprising a material having a structure that oxygen and an inactive group are bonded to silicon, over a substrate having a depressed portion;
    forming a conductive layer in the depressed portion over the layer;
    forming an insulating layer that covers the conductive layer;
    attaching a sticky member to the insulating layer;
    separating the conductive layer and the insulating layer from the substrate.

2. A method for forming a conductive layer according to claim 1,
    wherein the material is formed using a silane coupling agent.

3. A method for forming a conductive layer according to claim 1, further comprising the step of:
    forming the depressed portion in the substrate.

4. The method for forming a conductive layer according to claim 1, further comprising the steps of:
    removing the layer from a surface of the conductive layer and the insulating layer after separating the conductive layer and the insulating layer from the substrate; and
    attaching a flexible substrate to the conductive layer and the insulating layer.

5. The method for forming a conductive layer according to claim 1, wherein the conductive layer serves as an antenna.

6. The method for forming a conductive layer according to claim 1, wherein the conductive layer serves as a pixel electrode.

7. The method for forming a conductive layer according to claim 1, wherein the conductive layer serves as a wiring.

8. A method for manufacturing a substrate having a conductive layer comprising the steps of:
    forming a layer comprising a material having a structure that oxygen and an inactive group are bonded to silicon, over a substrate having a depressed portion;
    forming a conductive layer in the depressed portion over the layer;
    forming an insulating layer that covers the conductive layer;
    attaching a sticky member to the insulating layer;
    separating the conductive layer and the insulating layer from the substrate; and
    bonding a flexible substrate having an opening to the conductive layer and the insulating layer.

9. A method for forming a conductive layer according to claim 8,
    wherein the material is formed using a silane coupling agent.

10. A method for forming a conductive layer according to claim 8, further comprising the step of:
    forming the depressed portion in the substrate.

11. The method for manufacturing a substrate having a conductive layer according to claim 8, wherein the conductive layer serves as an antenna.

12. The method for manufacturing a substrate having a conductive layer according to claim 8, wherein the conductive layer serves as a pixel electrode.

13. The method for manufacturing a substrate having a conductive layer according to claim 8, wherein the conductive layer serves as a wiring.

14. A method for manufacturing a semiconductor device comprising the steps of:
    forming a layer comprising a material having a structure that oxygen and an inactive group are bonded to silicon, over a substrate having a depressed portion;
    forming a conductive layer in the depressed portion over the layer;
    forming an insulating layer that covers the conductive layer;
    attaching a sticky member to the insulating layer;
    separating the conductive layer and the insulating layer from the substrate; and
    electrically connecting the conductive layer and a connection terminal of an integrated circuit and bonding the insulating layer and the integrated circuit.

15. A method for forming a conductive layer according to claim 14,
    wherein the material is formed using a silane coupling agent.

16. A method for forming a conductive layer according to claim 14, further comprising the step of:
    forming the depressed portion in the substrate.

17. The method for manufacturing a semiconductor device according to claim 14, wherein the conductive layer serves as an antenna.

18. The method for manufacturing a semiconductor device according to claim 14, wherein the conductive layer serves as a pixel electrode.

19. The method for manufacturing a semiconductor device according to claim 14, wherein the conductive layer serves as a wiring.

20. A method for manufacturing a semiconductor device comprising the steps of:
- forming a layer comprising a material having a structure that oxygen and an inactive group are bonded to silicon, over a substrate having a depressed portion;
- forming a conductive layer in the depressed portion over the layer;
- forming an insulating layer that covers the conductive layer;
- attaching a sticky member to the insulating layer;
- separating the conductive layer and the insulating layer from the substrate;
- bonding a flexible substrate having an opening to the conductive layer and the insulating layer; and
- electrically connecting the conductive layer and a connection terminal of an integrated circuit in the opening of the flexible substrate and bonding the flexible substrate and the integrated circuit.

21. A method for forming a conductive layer according to claim 20,
wherein the material is formed using a silane coupling agent.

22. A method for forming a conductive layer according to claim 20, further comprising the step of:
forming the depressed portion in the substrate.

23. The method for manufacturing a semiconductor device according to claim 20, wherein the conductive layer serves as an antenna.

24. The method for manufacturing a semiconductor device according to claim 20, wherein the conductive layer serves as a pixel electrode.

25. The method for manufacturing a semiconductor device according to claim 20, wherein the conductive layer serves as a wiring.

* * * * *